(12) United States Patent
Hsieh

(10) Patent No.: US 7,215,207 B2
(45) Date of Patent: May 8, 2007

(54) PHASE AND FREQUENCY DETECTION CIRCUITS FOR DATA COMMUNICATION SYSTEMS

(75) Inventor: Hong-Yean Hsieh, Sunnyvale, CA (US)

(73) Assignee: Realtek Semiconductor Corporation, Hsinchu (TW)

( * ) Notice: Subject to any disclaimer, the term of this patent is extended or adjusted under 35 U.S.C. 154(b) by 112 days.

(21) Appl. No.: 11/190,323

(22) Filed: Jul. 26, 2005

(65) Prior Publication Data
US 2006/0250192 A1    Nov. 9, 2006

Related U.S. Application Data

(60) Provisional application No. 60/678,727, filed on May 4, 2005.

(51) Int. Cl.
*H03L 7/087* (2006.01)
(52) U.S. Cl. .............................. 331/14; 331/17; 331/18; 331/25
(58) Field of Classification Search ................ 331/1 A, 331/10–12, 14, 17, 18, 25, DIG. 2; 327/156–159; 332/127; 360/51; 375/376; 455/260
See application file for complete search history.

(56) References Cited

U.S. PATENT DOCUMENTS 4,535,459 A    8/1985   Hogge, Jr. et al.
5,057,793 A *  10/1991  Cowley et al. ............. 331/1 A

OTHER PUBLICATIONS

Ansgar Pottbacker, et al., "A Si Bipolar Phase and Frequency Detector IC for Clock Extraction Up to 8 Gb/s", IEEE Journal of Solid-State Circuits, Dec. 1992, pp. 1747-1751, vol. 27, No. 12.
David G. Messerschmitt, "Frequency Detectors for PLL Acquisition in Timing and Carrier Recovery", IEEE Transactions on Communications, Sep. 1979, pp. 1288-1295, vol. COM-27, No. 9.

* cited by examiner

*Primary Examiner*—David Mis
(74) *Attorney, Agent, or Firm*—Okamoto & Benedicto LLP

(57) ABSTRACT

In one embodiment, a phase-locked loop system in a receiver samples received incoming data using a first clock and a second clock that have the same frequency but are out of phase with each other. A first control signal generated by a phase detector is used to control a charge pump, whose output may be filtered to drive a VCO circuit generating the first and second clocks. A frequency detector generates a second control signal based at least on phase relationships between the incoming data and the first and second clocks. A qualifier circuit determines if the first control signal is valid or invalid based at least on the second control signal. If the first control signal is invalid, the qualifier circuit prevents the first control signal from being used to adjust the frequency of the first and second clocks.

20 Claims, 19 Drawing Sheets

PHASE AND FREQUENCY DETECTION CIRCUITS FOR DATA COMMUNICATION SYSTEMS

CROSS-REFERENCE TO RELATED APPLICATION

This application claims the benefit of U.S. Provisional Application No. 60/678,727, filed on May 4, 2005, incorporated herein by reference in its entirety.

BACKGROUND OF THE INVENTION

1. Field of the Invention

The present invention relates generally to data communication systems, and more particularly but not exclusively to phase and frequency detection circuits.

2. Description of the Background Art

In serial data communication systems, data bit streams are transmitted using a certain voltage waveform (e.g. NRZ (non-return to zero) waveform) via transmission lines to remote receivers. To reduce cost, a typical data communication system does not employ dedicated transmission lines to carry clock or timing information. In such a communication system, a remote receiver needs to extract the clock from the incoming data bit stream. Phase-locked-loops (PLLs) are often used in serial data receivers to extract clocks embedded in incoming data bit streams. A typical PLL consists of a phase/frequency detector, a loop filter, and a voltage-controlled oscillator (VCO). The VCO is used to generate a local clock, referred to as "VCO clock". The phase/frequency detector detects the phase and frequency differences between the VCO clock and the clock embedded in the incoming data bit stream. The phase and frequency differences are filtered by the loop filter and are used to control the frequency and consequently the phase of the VCO clock. The clock embedded in the incoming bit stream is thus recovered in a closed-loop manner by the PLL.

A phase detector (PD) is a key component of a PLL used for clock and data recovery. The phase detector enables the PLL to properly align the phase of the VCO clock with that of the incoming bit stream, so that the receiver can sample the incoming data bit stream at a proper timing instant, preferably at the midpoint of each bit interval. Linear phase detectors and binary phase detectors are two types of phase detectors normally used for clock and data recovery. An example linear phase detector is disclosed in U.S. Pat. No. 4,535,459. A linear phase detector generates a pulse representing the phase error between incoming data and VCO clock. The pulse width is proportional to the phase error. A problem with linear phase detectors is that they may not work well at very high-speed data rates because the detector has to generate a very narrow pulse for a small phase error. Unbalanced loading and delay mismatch can worsen this problem. Therefore, linear phase detectors suffer from a relatively large phase error. In a very high-speed link, a slight misalignment can lead to a significant increase of bit error rate.

A binary phase detector generates a pulse of fixed width, which usually covers one data bit interval, of a polarity indicating whether the incoming data or the VCO clock is leading in phase. A binary phase detector is also known as "bang-bang" because of its phase detection characteristic as shown in FIG. 1. A binary phase detector generates an output signal $V_{OUT}$ that is either positive or negative depending on the phase relationship between the incoming data and VCO clock. For example, the binary phase detector may be configured to generate a positive output signal $V_{Out}$ when the VCO clock is lagging the incoming data, and a negative output signal $V_{Out}$ when the VCO clock is leading the incoming data.

A phase detector by itself cannot capture the incoming data if the initial frequency of the VCO clock differs too much from the baud rate of the incoming data ("data baud rate"). In that case, a frequency detector (FD) has to be added into the loop to aid data acquisition. Commonly used frequency detectors can be classified into two categories: quadricorrelator frequency detectors and rotational frequency detectors. A quadricorrelator is well known for its analog implementations, which require many special analog components, such as rectifiers, differentiator, etc. These analog components are very sensitive to process, voltage, and temperature variations. If not carefully designed, a system employing a quadricorrelator may not function as expected.

In contrast to quadricorrelator frequency detectors, rotational frequency detectors are implemented using digital circuits. Rotational frequency detectors are disclosed in the following two papers: "A Si Bipolar Phase and Frequency Detector IC for Clock Extraction up to 8 Gigabit/s" by A. Pottbacker et al. in IEEE Journal of Solid State Circuits, December, 1992, pp 1747–1751 and "Frequency Detectors for PLL Acquisition In Timing and Carrier Recovery" by D. G. Messerschmitt in IEEE Trans. on Communications, September 1979, pp 1288–1295.

FIG. 2 shows a block diagram of a conventional PLL system 200 utilizing a phase and frequency detector. The PLL system 200 consists of a rotational frequency detector 222, a phase detector (PD) 206, a summer 208, a charge pump (CP) circuit 209, a low pass filter (LPF) 210, and a VCO 211. The rotational frequency detector 222 consists of an in-phase detector (IPD) 201, a quadrature-phase detector (QPD) 202, a frequency detector (FD) 203, and a summer 204. The rotational frequency detector 222 also includes a lock-in detector (LID) 207 used to detect whether the PLL system 200 has successfully locked in the frequency of the clock embedded in the incoming data (simply labeled as "DATA" in FIG. 2). When the frequency of the embedded clock is not yet locked, the LID 207 controls a tri-state buffer 205 to enable the rotational frequency detector output 226 to control the VCO 211 via the summer 208, the CP 209, and the LPF 210. When the frequency of the incoming data is locked in within a certain range, the LID 207 controls the tri-state buffer 205 to disable the rotational frequency detector output 226. In that case, the VCO 211 is solely controlled by the PD output 228. The PD output 228 represents the phase error between the in-phase clock CLK_I and the incoming data stream.

The VCO 211 generates an in-phase clock CLK_I and a quadrature-phase clock CLK_Q, which are 90 degrees out of phase with each other. As is conventional, the incoming data is used to sample both the in-phase clock CLK_I and the quadrature-phase clock CLK_Q by the in-phase detector 201 and by the quadrature-phase detector 202, respectively. Both IPD 201 and QPD 202 are binary phase detectors and compare the phase relationship between incoming data and their respective VCO clock. Their outputs are provided to the FD 203 to detect the frequency error. The IPD output 220 and the FD output 225 are combined by the summer 204, resulting in the output 226. When there is a frequency difference between the clock embedded in the incoming data and the VCO clock, the rotational frequency detector output 226 comprises pulses of exclusively the same polarity that depends on whether the VCO clock is faster or slower. In practice, however, due to circuit non-idealities and mismatches between the IPD output 220 and the FD output 225, the rotational frequency detector output 226 won't have the same polarity even when there is a frequency error. This degrades the performance of the PLL system 200. Furthermore, the output of the rotational frequency detector 222 needs to be disabled by the LID 207 when the VCO frequency has been locked to within a certain range, otherwise the rotational frequency detector 222 may disrupt phase locking. Unfortunately, the LID 207 may falsely detect an out-of-lock condition and improperly enable the rotational frequency detector output 226. This causes further PLL performance degradation.

SUMMARY

The present disclosure relates to a PLL system that employs phase and frequency detectors. In one embodiment, a phase detector asserts either an UP or DOWN signal (but not both) to drive a VCO faster or slower, respectively, when the sampling point of the phase detector lags or leads the midpoint of each bit interval. A frequency detector produces control signals in accordance with the difference in frequency between the baud rate of the incoming data and the frequency of the VCO clock. If the frequency detector determines that the clocking frequency of the VCO is higher than the baud rate of the incoming data, the control signals generated by the frequency detector will qualify the DOWN signals from the phase detector as valid signals and disqualify the UP signals from the phase detector as invalid signals, regardless of whether the UP signals are asserted or not. Similarly, if the frequency detector determines that the clocking frequency of the VCO is lower than the baud rate of the incoming data, the control signals generated by the frequency detector will qualify the UP signals from the phase detector as valid signals and disqualify the DOWN signals. The signals qualified as valid signals are fed to the charge-pump circuit to adjust the control voltage of the VCO. On the other hands, the disqualified signals are ignored, making the control voltage of the VCO unaffected by the disqualified signals. As can be appreciated, the selection of UP or DOWN signals to increase or decrease the frequency of the VCO clock, and other details regarding polarities and values of signals, are design choices that can be varied without detracting from the merits of the present invention.

The PLL system may detect phase and frequency errors by sampling the incoming data (e.g. NRZ data) at multiple phases of the VCO clocks. By inspecting relative transition times of the sampled waveforms, the difference between the baud rate of the incoming data and the clocking frequency of the VCO is decided. Once the incoming data is locked in (i.e. phase and frequency locked), the frequency detector produces control signals consistent with the charge UP/DOWN signals from the phase detector. For example, when the charge DOWN signal from the phase detector is asserted, the frequency detector will produce control signals to indicate that the clocking frequency of the VCO clock is higher than the baud rate of the incoming data. Then the charge DOWN signal will be qualified as a valid signal to reduce the control voltage of the VCO. Similarly, once the baud rate of the incoming data is locked and the VCO clock lags the incoming data, the frequency detector generates control signals such that an asserted charge UP signal is qualified as valid and the control voltage of the VCO is increased. The frequency detector thus advantageously operates transparently without influencing the operation of the phase detector during phase lock. Once the incoming data is out of lock, the frequency detector is brought back immediately to aid the acquisition of the phase and frequency of the incoming data. A false lock detection circuit may be used to determine if the PLL system is being false locked. Once the false-lock signal is asserted, the PLL system will temporarily ignore control signals from the frequency detector and allow the phase detector to work alone on the incoming data stream to bring the PLL system out of its false lock.

In one embodiment, the phase detector provides the retiming function as part of its operation to reduce the phase error. The frequency detector can act as an aided phase detector during phase lock to provide finer resolutions of phase difference between the incoming data and the VCO clock. Instead of generating a very narrow pulse for a small phase error as in linear phase detector, different amounts of charge UP/DOWN currents with a fixed pulse width may be fed to the charge-pump circuit depending on the phase difference. Therefore, a much smaller phase error can be achieved.

Embodiments of the present invention may be implemented as an all digital phase and frequency detector. This makes the PLL system advantageous in sub-micron VLSI technology. Furthermore, the PLL system can be extended to a half-rate clocking scheme. In other words, the VCO clock may be configured to run at one half of the baud rate of the incoming data, making the PLL system applicable to technology with limited bandwidth.

Some of the inventive aspects of the present invention are enumerated as follows. In a first aspect, the present invention provides a method and apparatus for aligning the phases and determining the frequency difference between the incoming data and the VCO clock. In a second aspect, the present invention provides a method and apparatus for eliminating the need for a lock-in detector. A false-lock detector is provided in some embodiments to detect false-locking. In a third aspect, the present invention provides an aided phase detector for achieving finer resolutions of phase error, thus resulting in a much smaller phase error during phase lock. In a fourth aspect, the present invention provides an all digital phase and frequency detector, which is suitable for very-large-scale-integrated (VLSI) implementations. In a fifth aspect, the present invention allows for a half-rate clocking scheme, which is suitable for high-speed implementations.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 3A:
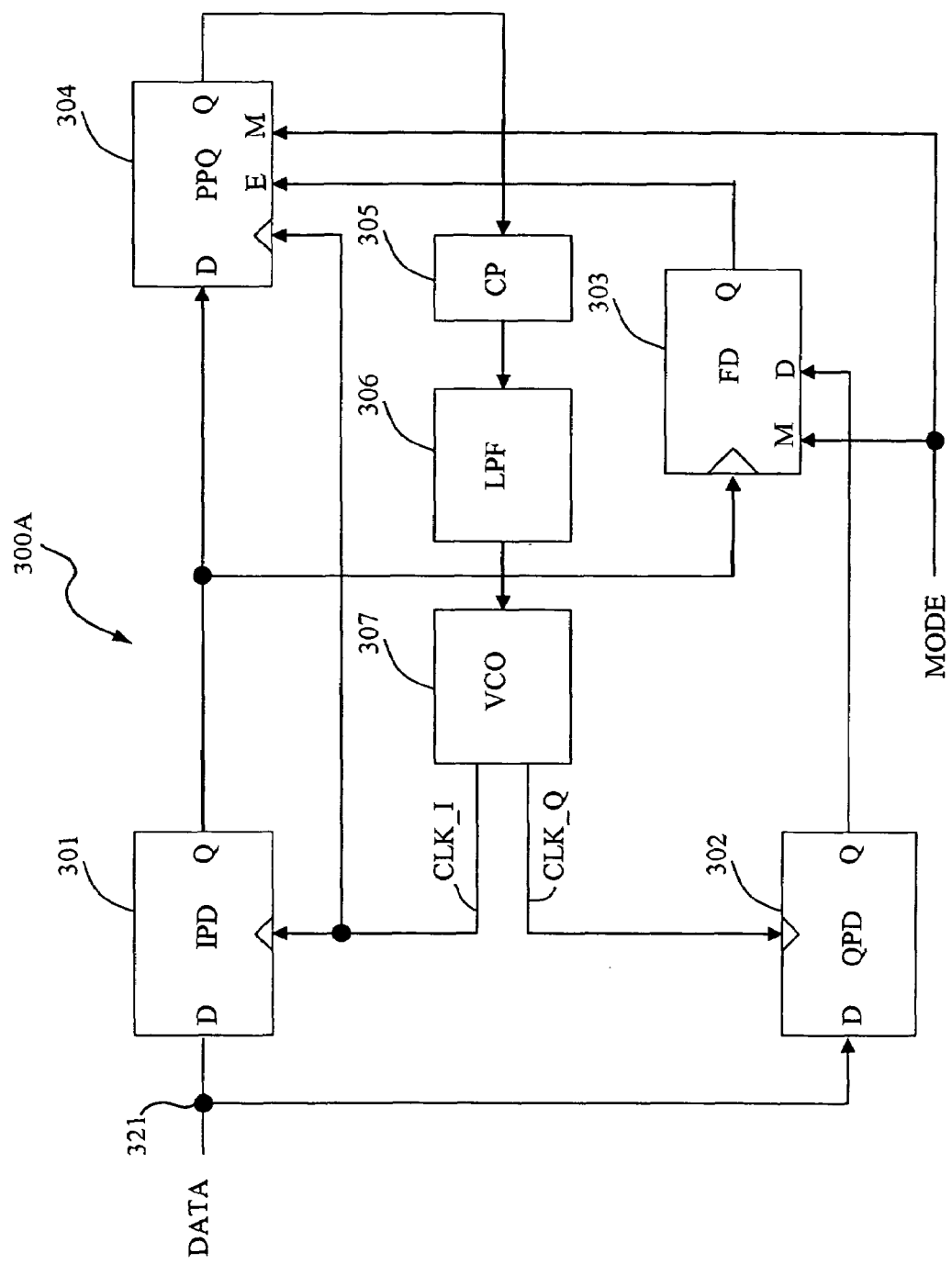
FIG. 3A shows a block diagram of a PLL system in accordance with an embodiment of the present invention.

FIG. 3A shows a block diagram of a PLL system 300A in accordance with an embodiment of the present invention. In the example of FIG. 3A, the PLL system 300A operates at the baud rate of the incoming data, also referred to as "input data" or simply "data", at a node 321. In one embodiment, the incoming data comprise non-return to zero (NRZ) data. Embodiments of the present invention may also be adapted to work with data encoded using encoding schemes other than NRZ without detracting from the merits of the present invention. The PLL system 300A may include an in-phase detector 301, a quadrature-phase detector 302, a frequency detector 303, a pump-pulse qualifier 304, a charge-pump circuit 305, a low-pass filter 306, and a voltage-controlled oscillator (VCO) 307. The VCO 307 generates an in-phase clock CLK_I and a quadrature-phase clock CLK_Q. The quadrature-phase clock CLK_Q and in-phase CLK_I are 90 degrees out of phase. In one embodiment, the rising edge of quadrature-phase clock CLK_Q lags the rising edge of the in-phase clock CLK_I by 90 degrees (see FIG. 4). The VCO 307 and the low pass filter 306 may comprise conventional circuitry.

The in-phase detector 301 employs the rising and falling edges of the in-phase clock CLK_I to sample the incoming data while the quadrature-phase detector 302 employs the rising and falling edges of the quadrature-phase clock CLK_Q to sample the incoming data. These four sample points allow the PLL system 300A to determine phase and frequency errors. The in-phase detector 301 compares the phase relationship between the in-phase clock CLK_I and the incoming data. The quadrature-phase detector 302 compares the phase relationship between the quadrature-phase clock CLK_Q and the incoming data. As will be more apparent below, the frequency detector 303 determines if the baud rate of the incoming data is higher or lower than the frequency of the VCO clock based on the outputs of the in-phase detector 301 and the quadrature-phase detector 302. The pump-pulse qualifier 304 qualifies the charge UP/DOWN signals from the in-phase detector 301 according to the decisions made by the frequency detector 303 and the input MODE signal. The charge-pump circuit 305 receives the charge UP/DOWN signals from the pump-pulse qualifier 304 and provides a control voltage to the low pass filter 306, which low-pass filters out the control voltage. The low-pass filtered control voltage is fed to the control input of the VCO 307 to adjust its running frequency. The in-phase clock CLK_I generated by the VCO 307 constitutes the clock information extracted from the incoming data.

As will be more apparent below, the frequency detector 303 operates as an aided phase detector when the MODE signal is enabled. This allows for finer resolutions of phase error, thus resulting in a much smaller phase error during phase lock of the PLL system 300A. The MODE signal may come from another circuit, a switch, a register or other configuration means without detracting from the merits of the present invention. When the MODE signal is disabled, the frequency detector 303 operates purely as a frequency detector and does not aid in phase detection.

Figure 1:
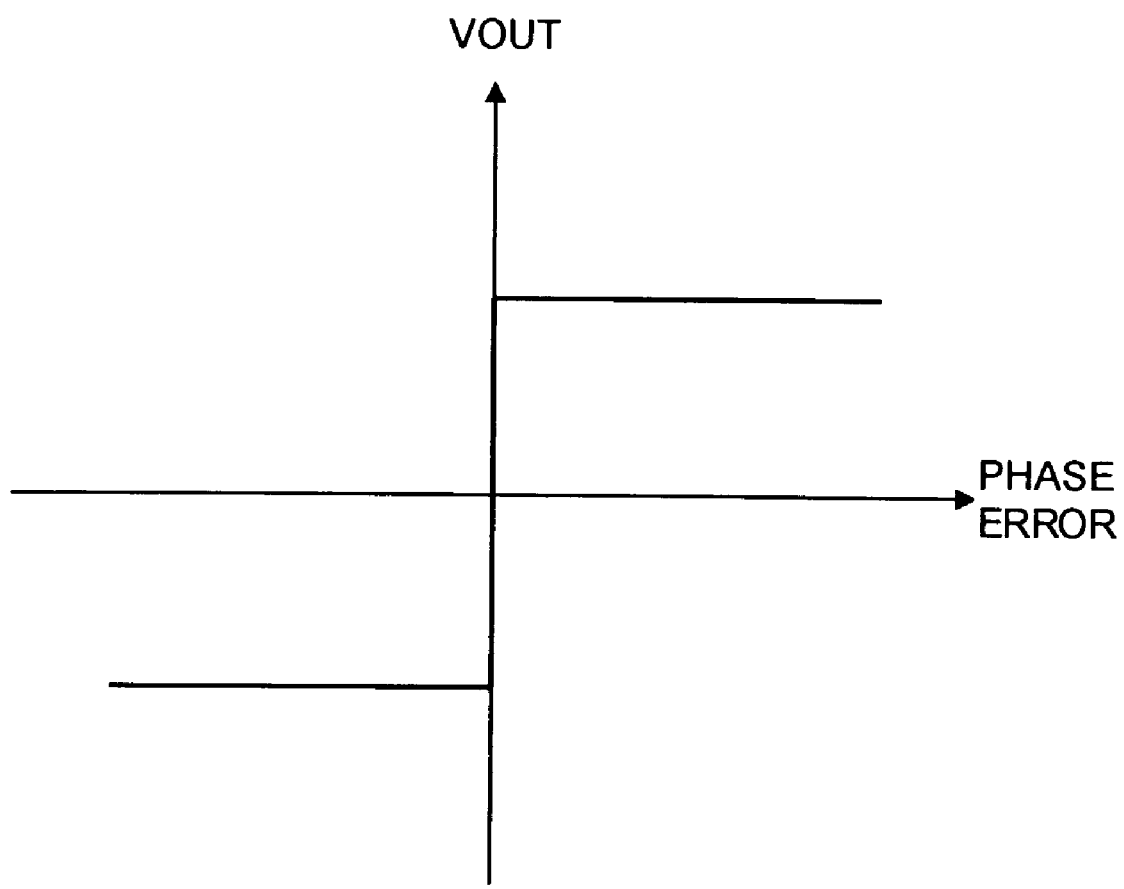
FIG. 1 shows the phase detection characteristic of a binary phase detector.
Figure 2:
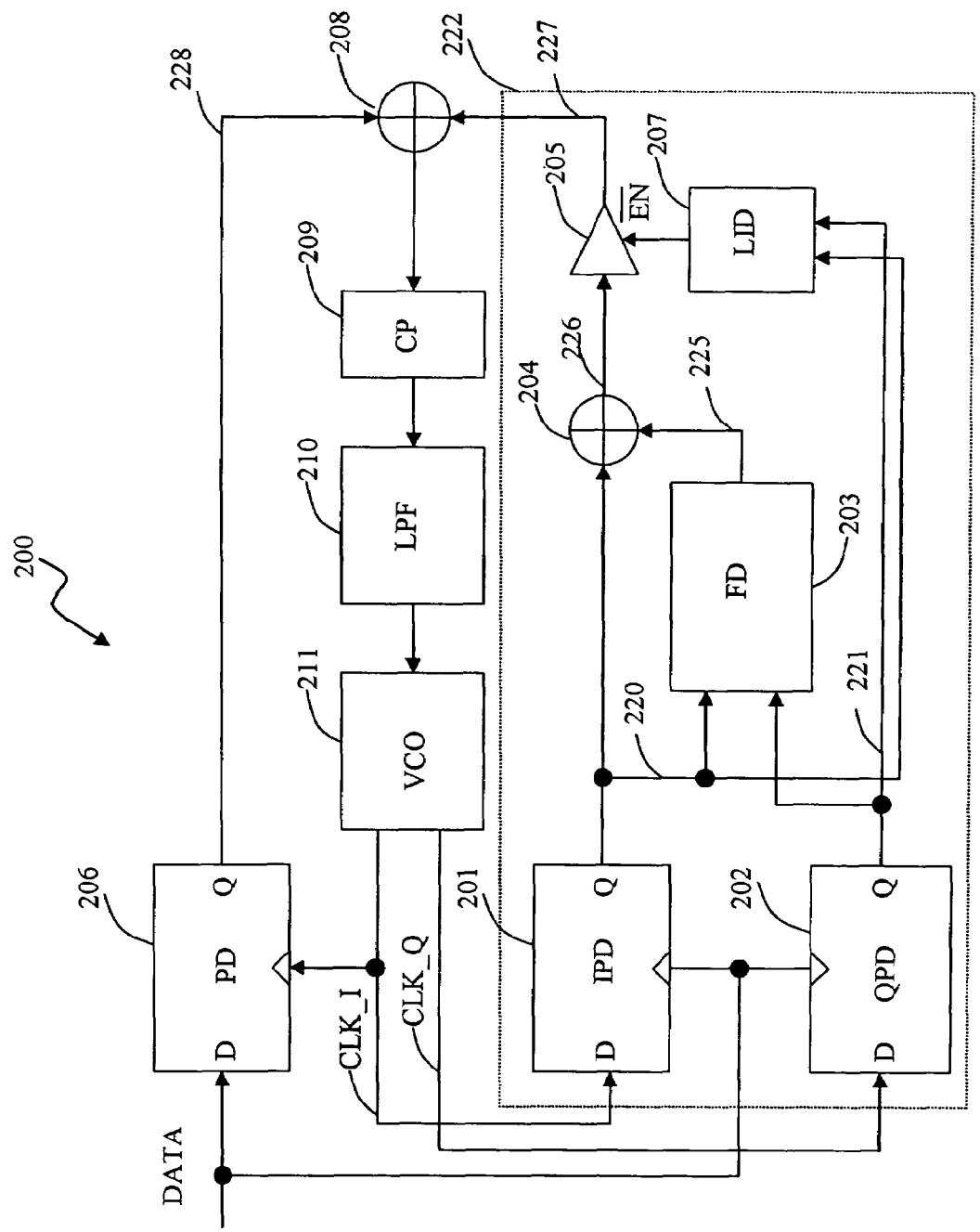
FIG. 2 shows a block diagram of a conventional phase-locked loop (PLL) system.

As shown in FIG. 3A, the incoming data at node 321 is sampled by the VCO clocks (clocks CLK_I and CLK_Q). This is in marked contrast to conventional phase-locked loops, which sample the VCO clocks using the incoming data (e.g. see FIG. 2 where the incoming data is employed to clock VCO clocks into the IPD 201 and QPD 202). Furthermore, instead of using an additional phase detector to align the phase of the VCO clocks with the incoming data, the sampled data from the in-phase detector 301 already aligns precisely with the VCO clocks during phase lock.

Figure 3B:
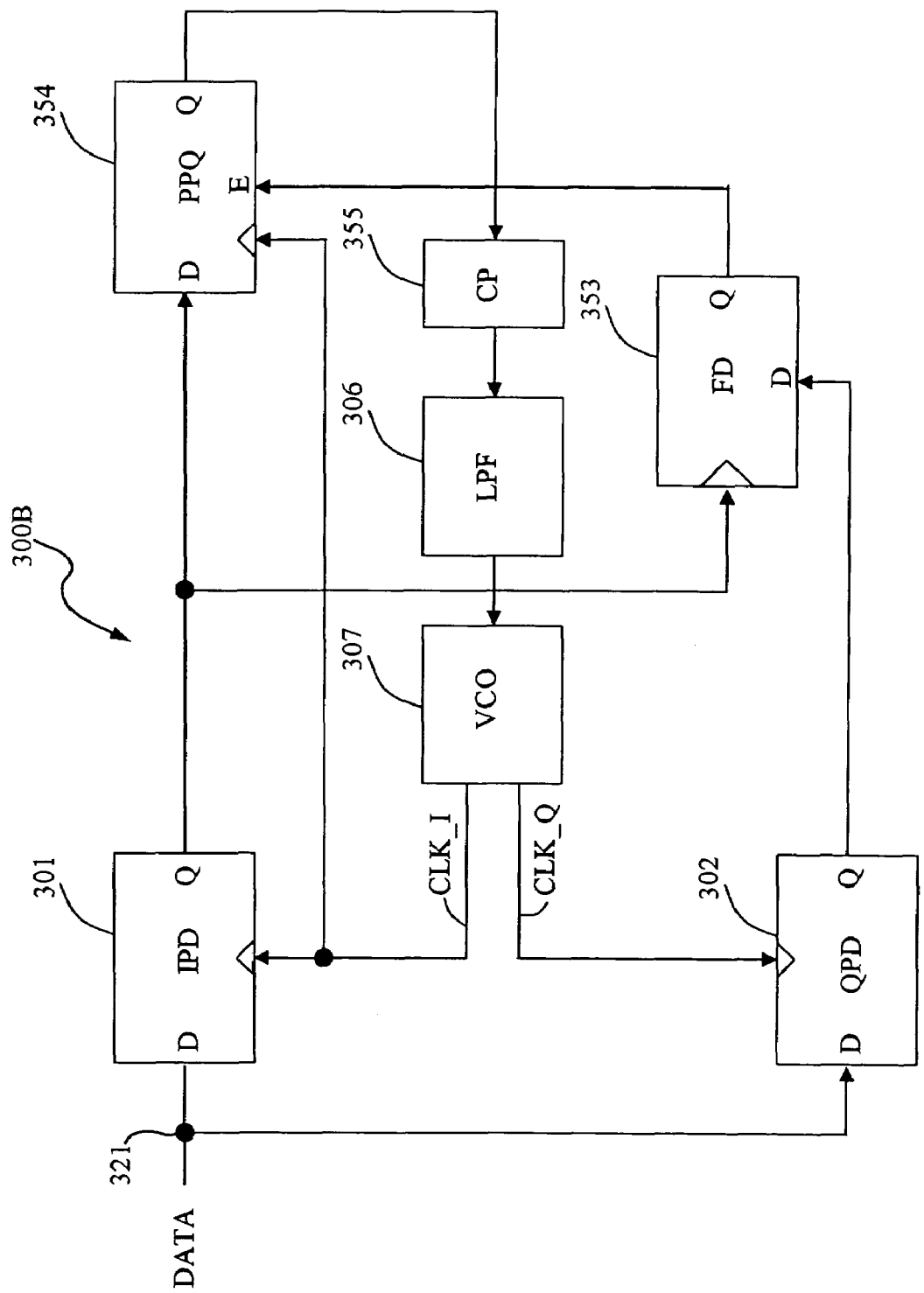
FIG. 3B shows a block diagram of another PLL system in accordance with an embodiment of the present invention.

FIG. 3B shows a block diagram of a PLL system 300B in accordance with an embodiment of the present invention. The PLL system 300B is a particular embodiment of the PLL system 300A where the MODE signal is always disabled. Accordingly, the pump-pulse qualifier 354, the charge pump 355 and the frequency detector 353 are similar in operation to their counterparts (i.e. the pump-pulse qualifier 304, the charge pump 305, and the frequency detector 303) in the PLL system 300A except that the MODE signal is assumed to be disabled. The basic operation and components of PLL systems 300A and 300B are otherwise the same. More details regarding the operation and components of PLL systems 300A and 300B are further discussed below.

It is to be noted that the lines among components of PLL system 300A and 300B shown in FIGS. 3A and 3B may comprise one or more signal lines depending on implementation. For example, the output "Q" of the in-phase detector 301 may comprise an UP signal and a DOWN (also referred to as "DN") signal to be provided to inputs "D" of pump-pulse qualifier 304 (or 354) and a lead/lag status signal to be provided to the clock input of the frequency detector 303 (or 353).

Figure 4:
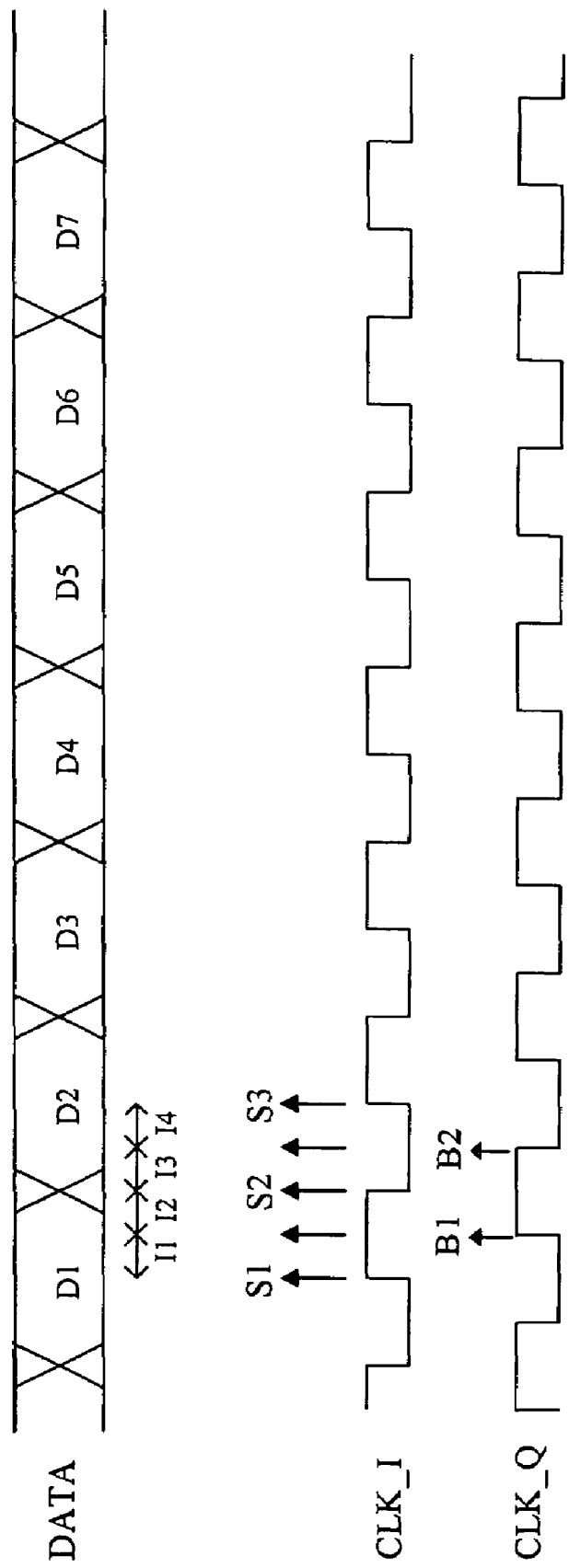
FIG. 4 shows waveforms illustrating the phase relationship during phase lock between the incoming data and VCO clocks in the PLL systems of FIGS. 3A and 3B.

FIG. 4 shows waveforms illustrating the phase relationship during phase lock between the incoming data and the VCO clocks in PLL systems 300A and 300B. In the example of FIG. 4, the incoming data are in NRZ form and labeled as "DATA" (D1, D2, D3, etc.). The edges of the incoming data where transitions occur, denoted by X's in FIG. 4, are also referred to simply as "data transition edges." The VCO 307 generates the in-phase clock CLK_I and the quadrature-phase clock CLK_Q. Clock CLK_I leads clock CLK_Q by 90 degrees. Clocks CLK_I and CLK_Q are used in the in-phase detector 301 and the quadrature-phase detector 302, respectively, to sample different points of the incoming data. As shown in FIG. 4, the time interval between the rising edges of clocks CLK_I and CLK_Q (i.e. between data samples S1 and B1) is denoted by I1. The time interval between the rising edge of clock CLK_Q and the falling edge of clock CLK_I (i.e. between data samples B1 and S2) is denoted by I2. The time interval between the falling edges of clocks CLK_I and CLK_Q (i.e. between data samples S2 and B2) is denoted by I3. The time interval between the falling edge of clock CLK_Q and the rising edge of clock CLK_I (i.e. between data samples B2 and S3) is denoted by I4. Time intervals I1, I2, I3, and I4 schematically represent the sample points employed by the PLL system 300 (i.e. 300A and 300B) to determine phase and frequency errors. Time intervals I1, I2, I3, and I4 are further referred to below.

Figure 5:
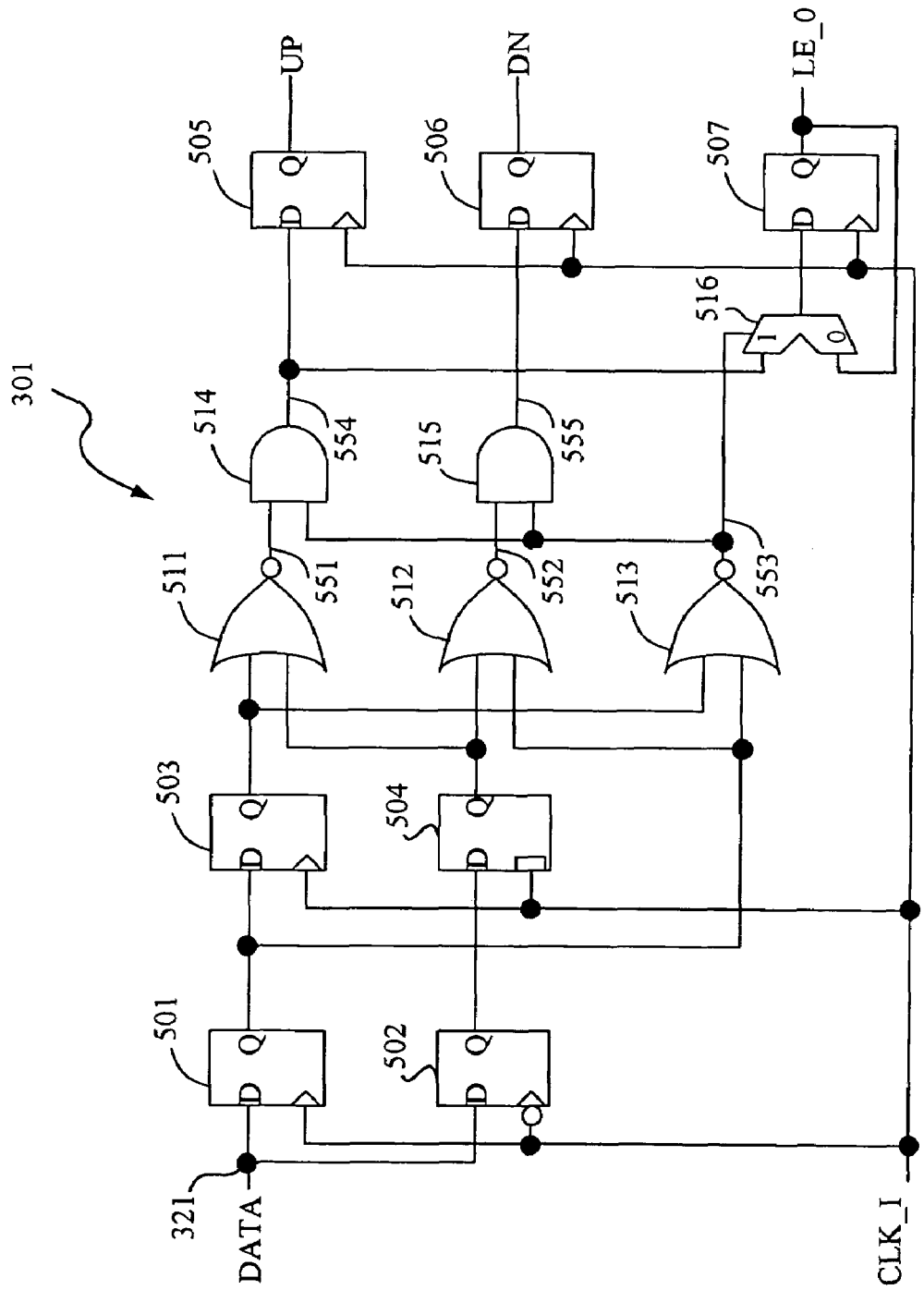
FIG. 5 shows a schematic diagram of an in-phase detector in accordance with an embodiment of the present invention.

FIG. 5 shows a schematic diagram of an in-phase detector 301 in accordance with an embodiment of the present invention. The in-phase detector 301 is configured to determine the phase relationship between the incoming data at the node 321 and the in-phase clock CLK_I generated by the VCO 307. In the example of FIG. 5, the incoming data are sampled by the rising and falling edges of clock CLK_I by way of flip-flops 501 and 502. In-phase detector 301 asserts the output signal UP if the falling edge of clock CLK_I lags the data transition edge, and asserts the output signal DN (i.e. "DOWN") if the falling edge of clock CLK_I leads the data transition edge. The UP and DN signals are input to a pump-pulse qualifier (either PPQ 304 or 354) to be qualified prior to being used to control the charge pump that drives the VCO 307.

The output signal LE_0 represents the lead/lag status in the last data transition between the falling edge of clock CLK_I and the data transition edge. If the falling edge of clock CLK_I lags the data transition edge, the output signal LE_0 is asserted. Otherwise, output signal LE_0 is de-asserted. The output signal LE_0 is provided to a frequency detector (e.g. FD 303 or 353) to allow the frequency detector to compare the baud rate of the incoming data to the clocking frequency of the VCO 307.

In the example of FIG. 5, flip-flops 501 and 502 sample the incoming data by the rising and falling edges of clock CLK_I, respectively. Theoretically, the data point sampled by the rising edge is at the midpoint of each bit interval and the data point sampled by the falling edge is at the nominal data transition edges during phase lock. These sampled points allow for determination of whether clock CLK_I leads or lags the incoming data. If the data point sampled by the falling edge of CLK_I (data sample S2) leads the data transition edge (shown as an "X" in DATA of FIG. 4), the output signal DN is asserted to lower the frequency of the VCO 307. The value of the output signal DN is determined by inspecting three data samples S1, S2, and S3 using clock CLK_I (see FIG. 4). If the data samples S2 and S3 are different, and there exists a transition between the data samples S1 and S3, signal DN is asserted. Otherwise, signal DN is de-asserted.

If the data point sampled by the falling edge of clock CLK_I (data sample S2) lags the data transition edge (shown as an "X" in DATA of FIG. 4), the output signal UP is asserted to increase the frequency of the VCO 307. If the data samples S1 and S2 are different, and there exists a transition between the data samples S1 and S3, signal UP is asserted. Otherwise, signal UP is de-asserted. The output signal LE_0 represents the lead/lag status in the last data transition between the falling edge of clock CLK_I and the data transition edge. If the output signal LE_0 is asserted, clock CLK_I lags the incoming data in the last data transition. If the output signal LE_0 is de-asserted, clock CLK_I leads the incoming data in the last data transition.

Flip-flop 503 delays the output signal from flip-flop 501 by one clock cycle. Latch 504 delays the output signal from flip-flop 502 by one half of the clock cycle such that the sampled data by the rising and falling edges of clock CLK_I is aligned in the same time frame for the combinational logic to process the data. EXCLUSIVE-OR gate 511 produces binary one at its output 551 if clock CLK_I lags the incoming data. Otherwise, a binary zero is produced. Similarly, EXCLUSIVE-OR gate 512 produces binary one at its output 552 if clock CLK_I leads the incoming data. If there is a transition between two consecutive data bits, EXCLUSIVE-OR gate 513 asserts signal 553. Signal 553 ensures that signals 554 and 555 will not be both set to binary one at the same time by AND gates 514 and 515. If signal 553 is asserted, the signal 554 is loaded into flip-flop 507, which latches the lead/lag status in the last data transition, by way of multiplexer 516.

Figure 6:
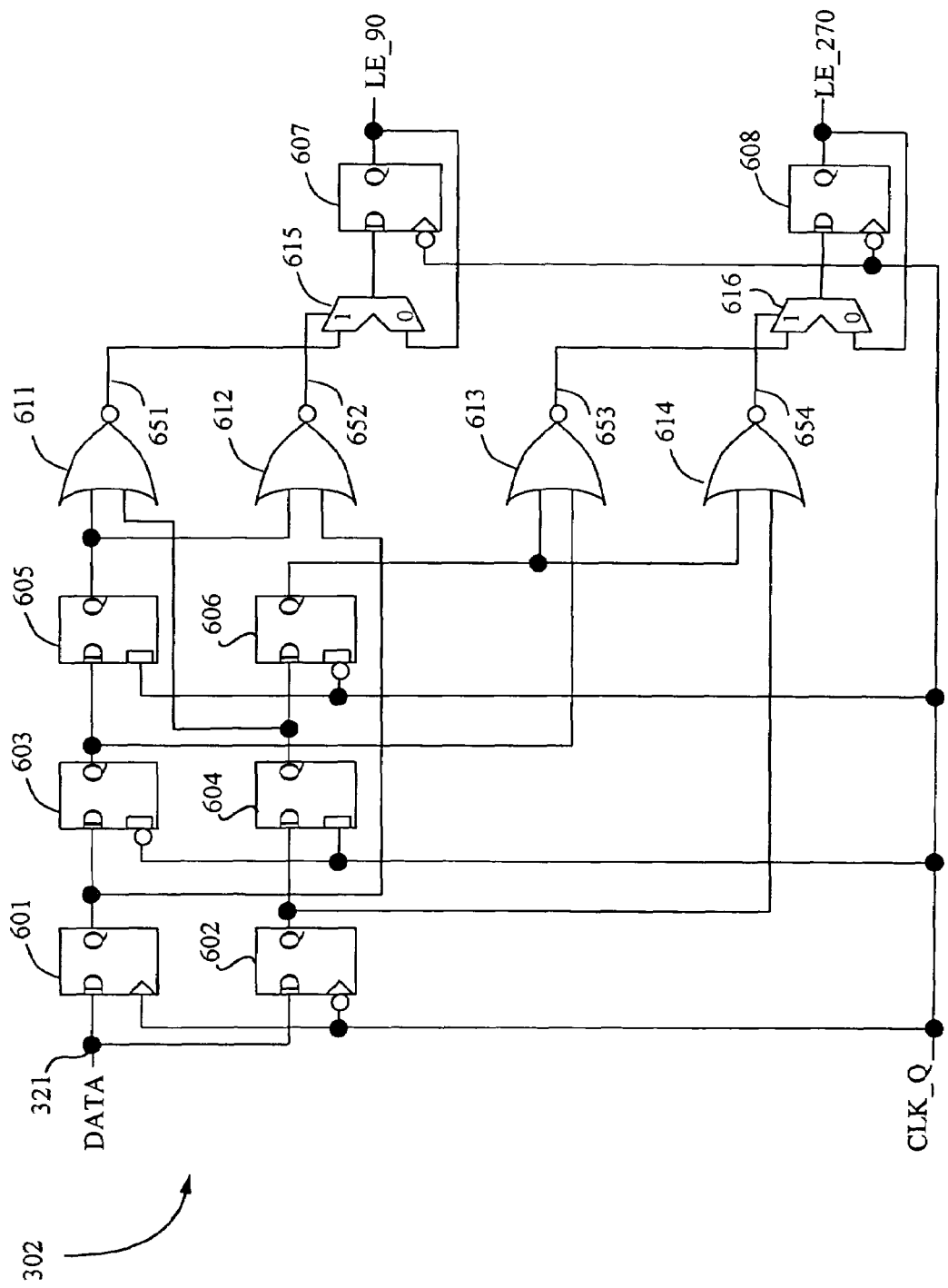
FIG. 6 shows a schematic diagram of a quadrature-phase detector in accordance with an embodiment of the present invention.

FIG. 6 shows a schematic diagram of a quadrature-phase detector 302 in accordance with an embodiment of the present invention. The quadrature-phase detector 302 is configured to determine the phase relationship between the incoming data and the quadrature-phase clock CLK_Q. The incoming data is sampled by the rising and falling edges of clock CLK_Q by way of flip-flops 601 and 602. The output signal LE_90 represents the lead/lag status in the last data transition between the falling edge of clock CLK_Q and the data transition edge. If the falling edge of clock CLK_Q lags the data transition edge, the output signal LE_90 is asserted. Otherwise, the output signal LE_90 is de-asserted. The output signal LE_270 represents the lead/lag status in the last data transition between the rising edge of clock CLK_Q and the data transition edge. If the rising edge of clock CLK_Q lags the data transition edge, the output signal LE_270 is asserted. Otherwise, the output signal LE_270 is de-asserted. Output signals LE_90 and LE_270 are provided to a frequency detector (e.g. FD 303 or 353) to allow the frequency detector to compare the baud rate of the incoming data to the clocking frequency of the VCO 307.

In the example of FIG. 6, flip-flops 601 and 602 are used to sample the incoming data at the node 321 by the rising and falling edges of clock CLK_Q (see samples B1 and B2 in clock CLK_Q of FIG. 4). Latches 603, 604, 605, and 606 are used to align the sampled data in order to detect if the rising and falling edges of clock CLK_Q lead or lag the incoming data. If the falling edge of clock CLK_Q lags the data transition edge, signal 651 is asserted by EXCLUSIVE-OR gate 611. Otherwise, signal 651 is de-asserted. Signal 652 is asserted by EXCLUSIVE-OR gate 612 if there is a transition between the two consecutive rising edges of clock CLK_Q. If signal 652 is asserted, the signal 651 is loaded into flip-flop 607 by way of a multiplexer 615 at the falling edge of clock CLK_Q. The output signal LE_90 represents the lead/lag status in the last data transition between the falling edge of clock CLK_Q and the data transition edge.

Similarly, if the rising edge of clock CLK_Q lags the data transition edge, signal 653 is asserted by EXCLUSIVE-OR gate 613. Otherwise, it is de-asserted. Signal 654 is asserted by EXCLUSIVE-OR gate 614 if there is a transition between the two consecutive falling edges of clock CLK_Q. If signal 654 is asserted, the signal 653 is loaded into flip-flop 608 by way of multiplexer 616 at the falling edge of clock CLK_Q. The output signal LE_270 represents the lead/lag status in the last data transition between the rising edge of clock CLK_Q and the data transition edge.

Figure 7:
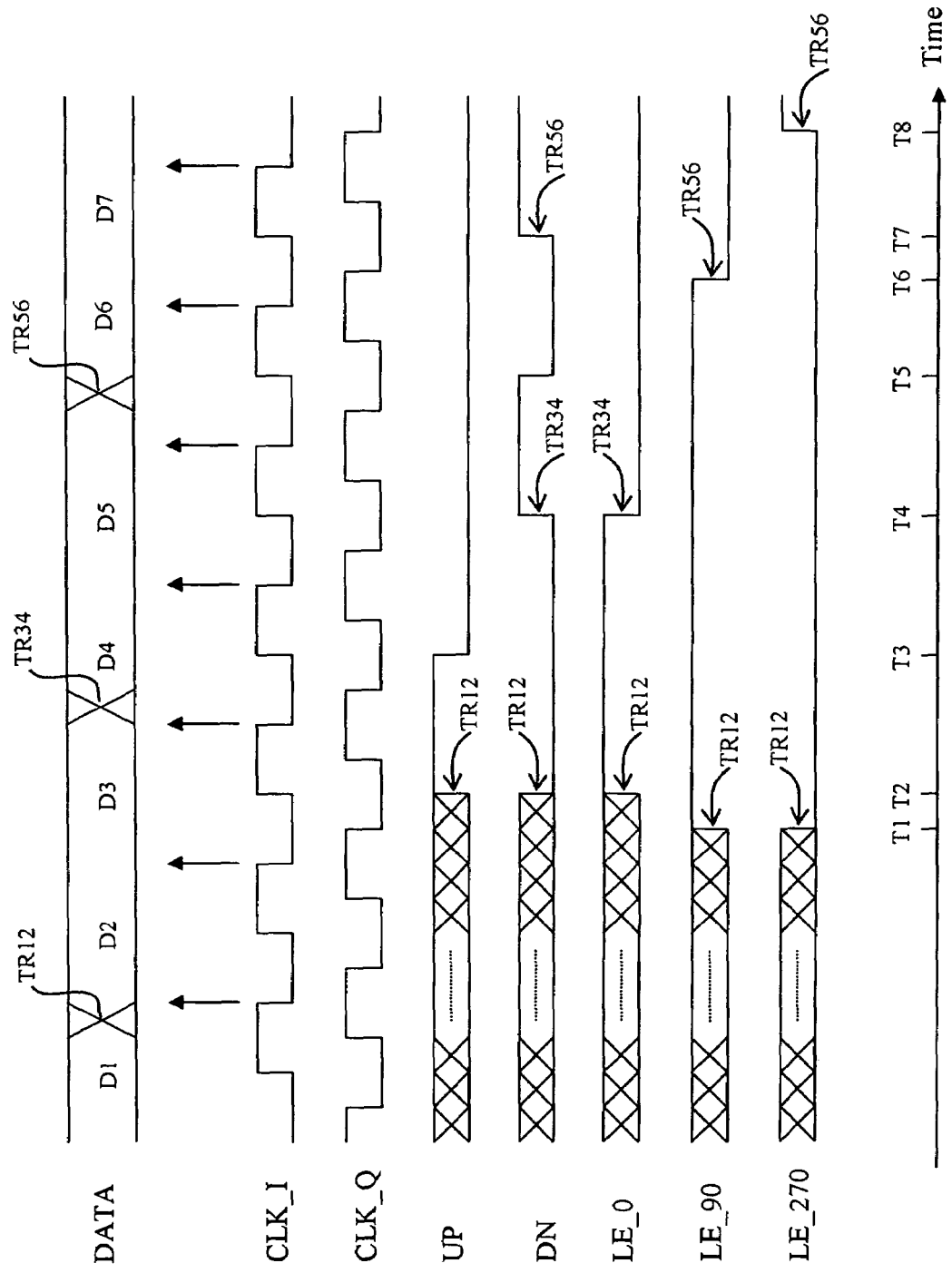
FIG. 7 shows example output waveforms of the in-phase detector of FIG. 5 and the quadrature-phase detector of FIG. 6 for corresponding data transitions.

FIG. 7 shows example output waveforms of the in-phase detector 301 and the quadrature-phase detector 302 for corresponding data transitions. There are three data transition edges namely, TR12, TR34, and TR56 in this example. As shown in FIG. 7, transition edge TR12 leads the falling edge of clock CLK_I while transition edges TR34 and TR56 lag the falling edges of the in-phase clock CLK_I. The output signal UP is asserted at time T2 due to transition edge TR12. Signal DN is asserted at time T4 and time T7 due to transition edges TR34 and TR56, respectively. If there is no transition, signals UP and DN are just de-asserted. The output signal LE_0 represents the lead/lag status in the last data transition between the falling edge of clock CLK_I and the data transition edge. In this case, output signal LE_0 is asserted and de-asserted at times T2 and T4, respectively, due to transition edges TR12 and TR34.

As shown in FIG. 7, transition edges TR12 and TR34 lead the falling edges of quadrature-phase clock CLK_Q while transition edge TR56 lags the falling edge of clock CLK_Q. The output signal LE_90 represents the lead/lag status in the last data transition between the falling edge of clock CLK_Q and the data transition edge. In this case, the output signal LE_90 is asserted and de-asserted at times T1 and T6, respectively, due to transition edges TR12 and TR56.

Still referring to FIG. 7, transition edges TR12 and TR34 lag the rising edges of clock CLK_Q while transition edge TR56 leads the rising edge of clock CLK_Q. The output signal LE_270 represents the lead/lag status in the last data transition between the rising edge of clock CLK_Q and the data transition edge. In this case, the output signal LE_270 is de-asserted and asserted at times T1 and T8, respectively, due to transition edges TR12 and TR56.

Figure 8A:
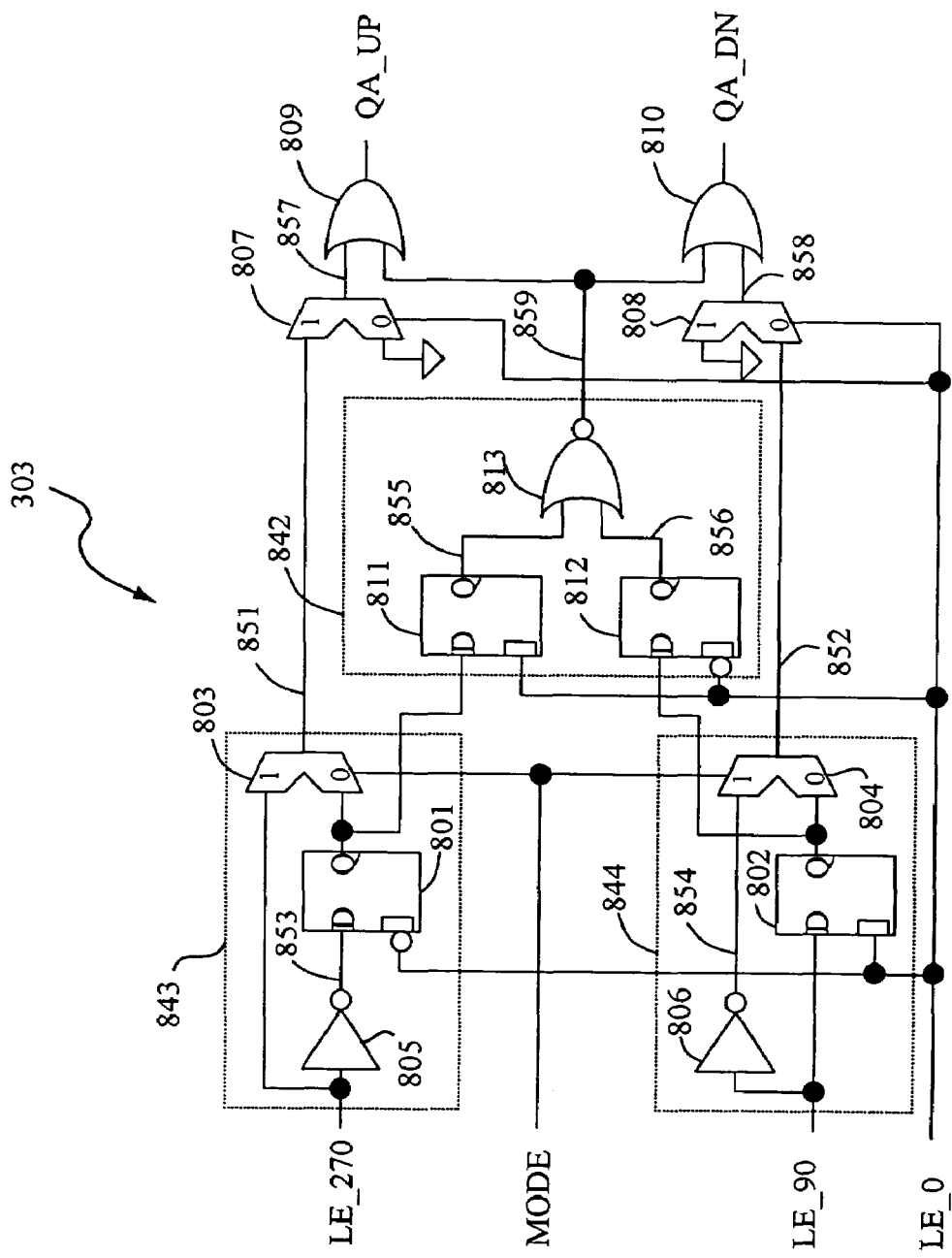
FIG. 8A shows a schematic diagram of a frequency detector for the PLL system of FIG. 3A in accordance with an embodiment of the present invention.

FIG. 8A shows a schematic diagram of a frequency detector 303 in accordance with an embodiment of the present invention. In one embodiment, the frequency detector 303 is configured to determine if the baud rate of the incoming data is higher or lower than the clocking frequency of the VCO 307 based on the phase relationships between the incoming data and the in-phase clock CLK_I and between the incoming data and the quadrature-phase clock CLK_Q. Depending on whether the baud rate of the incoming data is higher or lower than the clocking frequency of the VCO 307, the frequency detector 303 is configured to generate control signals QA_UP and QA_DN, which are both fed to the pump-pulse qualifier 304. Signals QA_UP and QA_DN qualify the signals UP and DN from the in-phase detector 301, respectively, in the pump-pulse qualifier 304. If a control signal of the frequency detector 303 is asserted, the corresponding pump pulse from the in-phase detector 301 is qualified as a valid pulse and fed to the charge-pump circuit 305. Otherwise, the pump pulse is disqualified as an invalid pulse and not provided to the charge pump circuit 305. The frequency detector 303 receives its input signal LE_0 from the in-phase detector 301, and its input signals LE_90 and LE_270 from the quadrature-phase detector 302. Signals LE_0, LE_90, and LE_270 allow the frequency detector 302 to determine if the baud rate of the incoming data is higher or lower than the clocking frequency of the VCO 307.

The input signal MODE comes from an external interface, such as another circuit, a switch, or a register, for example. When the input MODE signal is disabled, the control signal QA_UP is asserted if the clocking frequency of the VCO 307 is lower than the data baud rate (i.e. baud rate of the incoming data). On the other hand, if the clocking frequency of the VCO 307 is greater than the data baud rate, the control signal QA_DN is asserted. During phase lock, the control signals QA_UP and QA_DN are configured to be consistent with the output signals UP and DN from the in-phase detector 301. Thus, the frequency detector 303 operates transparently without influencing the operation of the in-phase detector 301 during phase lock.

Figure 9A:
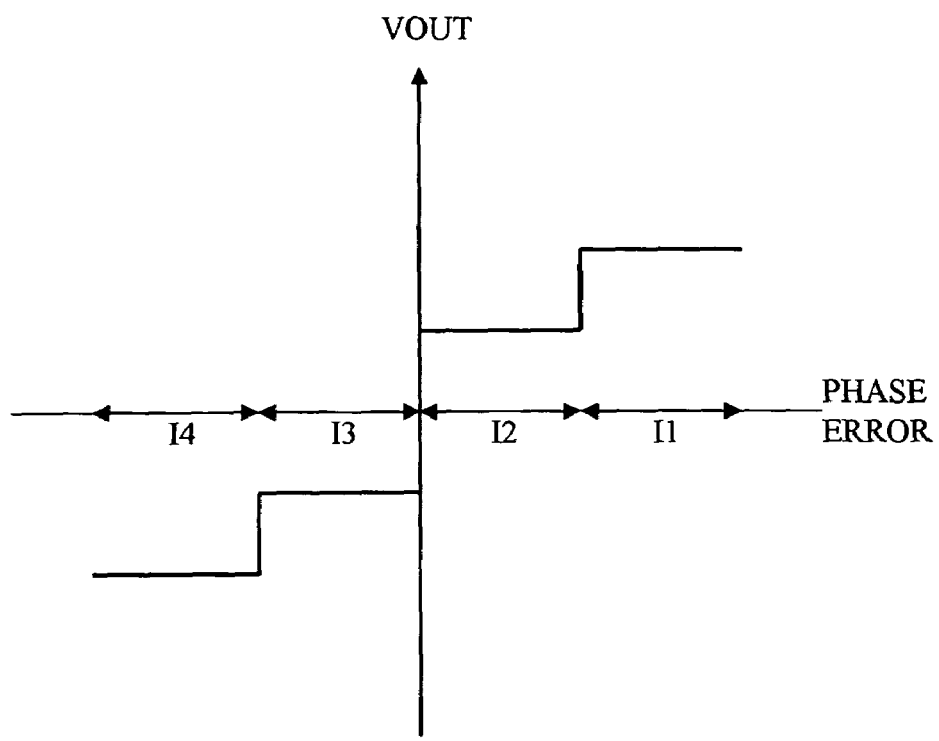
FIG. 9A shows the phase detection characteristic of the PLL system of FIG. 3A when the input MODE signal is enabled.

When the input MODE signal is enabled during phase lock, the control signal QA_UP is asserted if the data transition falls in the interval I1, which is between a rising edge of clock CLK_I and the following rising edge of clock CLK_Q (see FIG. 4). If any data transition falls outside of the interval I1, the control signal QA_UP is de-asserted. If the data transition falls in the interval I4, which is between a falling edge of the clock CLK_Q and the following rising edge of the clock CLK_I (see FIG. 4), the control signal QA_DN is asserted. If any data transition falls outside of the interval I4, the control signal QA_DN is de-asserted. When either controls signals QA_UP or QA_DN is asserted in this case, the charge-pump circuit 305 can pump up/down more current into the loop filter (i.e. low pass filter 306) to result in a smaller phase error. Under this condition, the frequency detector 303 acts as an aided-phase detector. FIG. 9A shows the phase detection characteristic of the PLL system 300A when the input MODE signal is enabled.

In the example of FIG. 8A, control signals QA_UP and QA_DN are generated by a pair of OR gates 809 and 810. The input of OR gate 809 is fed by two signals 857 and 859, while the input of OR gate 810 is fed by two signals 858 and 859. Signals 857 and 858 are qualifiers for the charge up and down pulses, respectively.

The frequency detector 303 includes a false lock detector 842 comprising a NOR gate 813 and latches 811 and 812. The false-lock detector 842 generates a false lock signal 859. If signal 859 is asserted, it indicates that the PLL system 300A is being false locked. Signal 859 will assert both control signals QA_UP and QA_DN, and therefore temporarily qualify all the pump pulses from the in-phase detector 301 as valid pulses when the PLL system 300A is being false locked. Signal 859 is asserted if signals 855 and 856 are both equal to binary zero. Signal 855 is set to binary zero if the input signal LE_270 is equal to one at the rising edge of signal LE_0. Signal 856 is set to binary zero if the input signal LE_90 is equal to zero at the falling edge of signal LE_0. Note that during false lock, the signals 855 and 856 will be cleared to binary zero because the data transition edges are jittering around the rising edges of the in-phase clock CLK_I. Multiplexers 807 and 808 generate signals 857 and 858, respectively, based on signals 851, 852, and LE_0. When the input signal LE_0 is equal to zero, signal 857 is always set to zero and signal 858 is fed by signal 852. When the input signal LE_0 is equal to one, signal 858 is always set to zero and signal 857 is fed by signal 851.

The input MODE signal controls the operation of multiplexers 803 and 804. When the input MODE signal is disabled, signal 851 is generated by latch 801 while signal 852 is generated by latch 802. Latch 801 is transparent when the input signal LE_0 is zero, and stores the inverted input signal LE_270 at the rising edge of the input signal LE_0. If signal 851 is asserted at the rising edge of the input signal LE_0, it indicates that the clocking frequency of the VCO 307 is slow. Similarly, latch 802 is transparent when the input signal LE_0 is binary one, and stores the input signal LE_90 at the falling edge of the input signal LE_0. If signal 852 is asserted at the falling edge of the input signal LE_0, it indicates that the clocking frequency of the VCO 307 is fast.

When the input MODE signal is enabled, signal 851 changes in accordance with the input signal LE_270 and signal 852 changes in accordance with the inverted input signal LE_90. If signal 851 is asserted in this case, it indicates that the last data transition falls in the time interval I1. If signal 852 is asserted in this case, it indicates that the last data transition falls in the time interval I4.

Figure 8B:
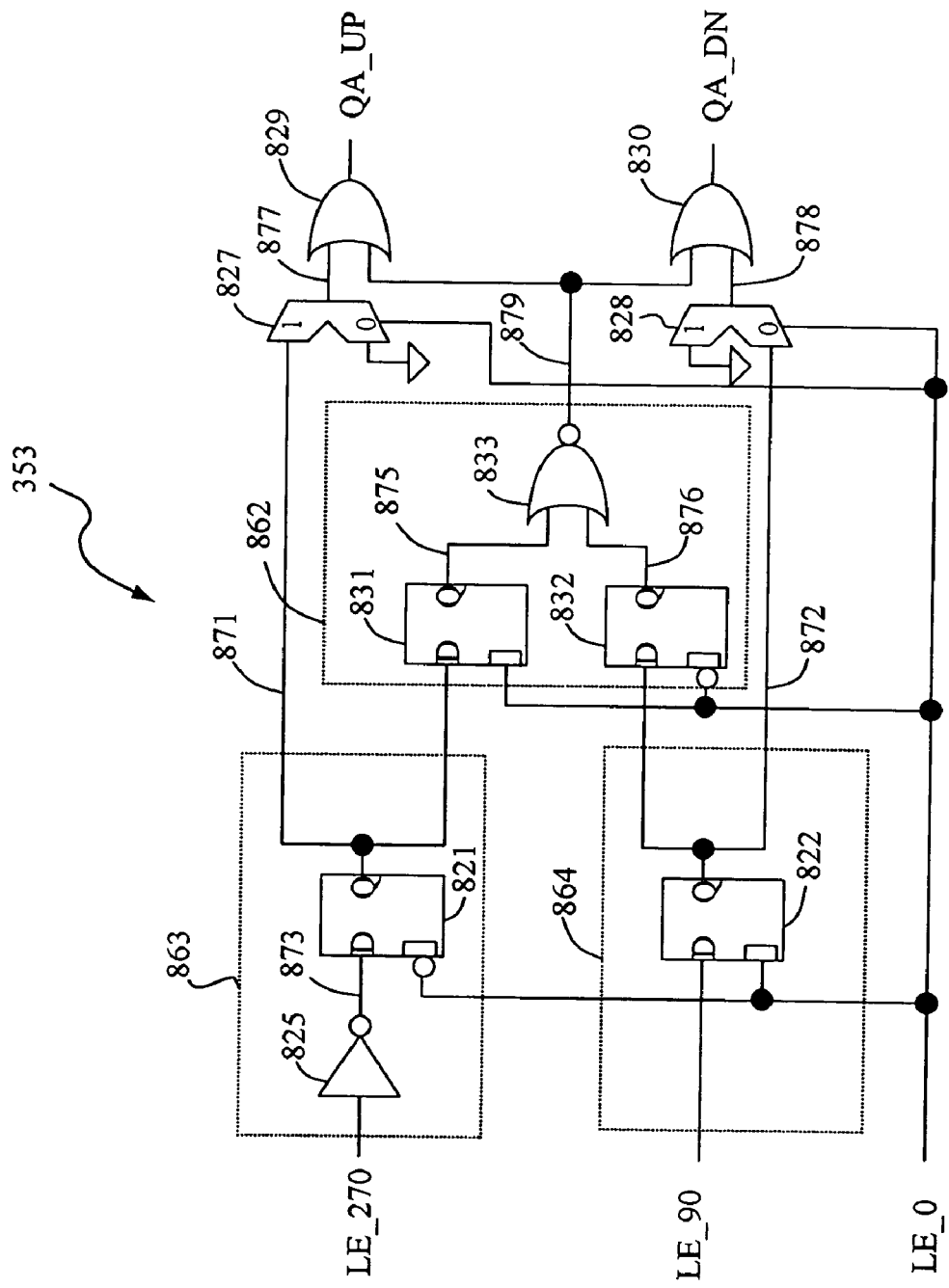
FIG. 8B shows a schematic diagram of a frequency detector for the PLL system of FIG. 3B in accordance with an embodiment of the present invention.

FIG. 8B shows a schematic diagram of a frequency detector 353 in accordance with an embodiment of the present invention. The frequency detector 353 operates the same as the frequency detector 303 when the input MODE signal is disabled in the frequency detector 303. Accordingly, components that support the input MODE signal in frequency detector 303 have been removed from the frequency detector 353 to minimize cost. Frequency detectors 303 and 353 otherwise operate the same way.

Still referring to FIG. 8B, signals LE_270, LE_90, LE_0, QA_UP, and QA_DN serve the same purpose as in the frequency detector 303. Signal LE_0 is provided by the in-phase detector 301, while signals LE_270 and LE_90 are provided by the quadrature-phase detector 302. In the case of the frequency detector 353, the control signals QA_UP and QA_DN are provided to the pump-pulse qualifier 354 to qualify the UP and DN signals generated by the in-phase detector 301 for driving the charge pump 355.

In the example of FIG. 8B, control signals QA_UP and QA_DN are generated by a pair of OR gates 829 and 830. The input of OR gate 829 is fed by two signals 877 and 879, while the input of OR gate 830 is fed by two signals 878 and 879. Signals 877 and 878 are qualifiers for the charge up and down pulses, respectively.

The frequency detector 353 includes a false lock detector 862 comprising a NOR gate 833 and latches 831 and 832. The false-lock detector 862 generates a false lock signal 879. If signal 879 is asserted, it indicates that the PLL system 300B is being false locked. Signal 879 will assert both control signals QA_UP and QA_DN, and therefore temporarily qualify all the pump pulses from the in-phase detector 301 as valid pulses when the PLL system 300B is being false locked. Signal 879 is asserted if signals 875 and 876 are both equal to binary zero. Signal 875 is set to binary zero if the input signal LE_270 is equal to binary one at the rising edge of signal LE_0. Signal 876 is set to binary zero if the input signal LE_90 is equal to binary zero at the falling edge of signal LE_0. Multiplexers 827 and 828 generate signals 877 and 878, respectively, based on signals 871, 872, and LE_0. When the input signal LE_0 is equal to zero, signal 877 is always set to zero and signal 878 is fed by signal 872. When the input signal LE_0 is equal to one, signal 878 is always set to zero and signal 877 is fed by signal 871.

Signal 871 is generated by latch 821 while signal 872 is generated by latch 822. Latch 821 is transparent when the input signal LE_0 is zero, and stores the inverted input signal LE_270 at the rising edge of the input signal LE_0. If signal 871 is asserted at the rising edge of the input signal LE_0, it indicates that the clocking frequency of the VCO 307 is slow. Similarly, latch 822 is transparent when the input signal LE_0 is binary one, and stores the input signal LE_90 at the falling edge of the input signal LE_0. If signal 872 is asserted at the falling edge of the input signal LE_0, it indicates that the clocking frequency of the VCO 307 is fast.

Figure 10:
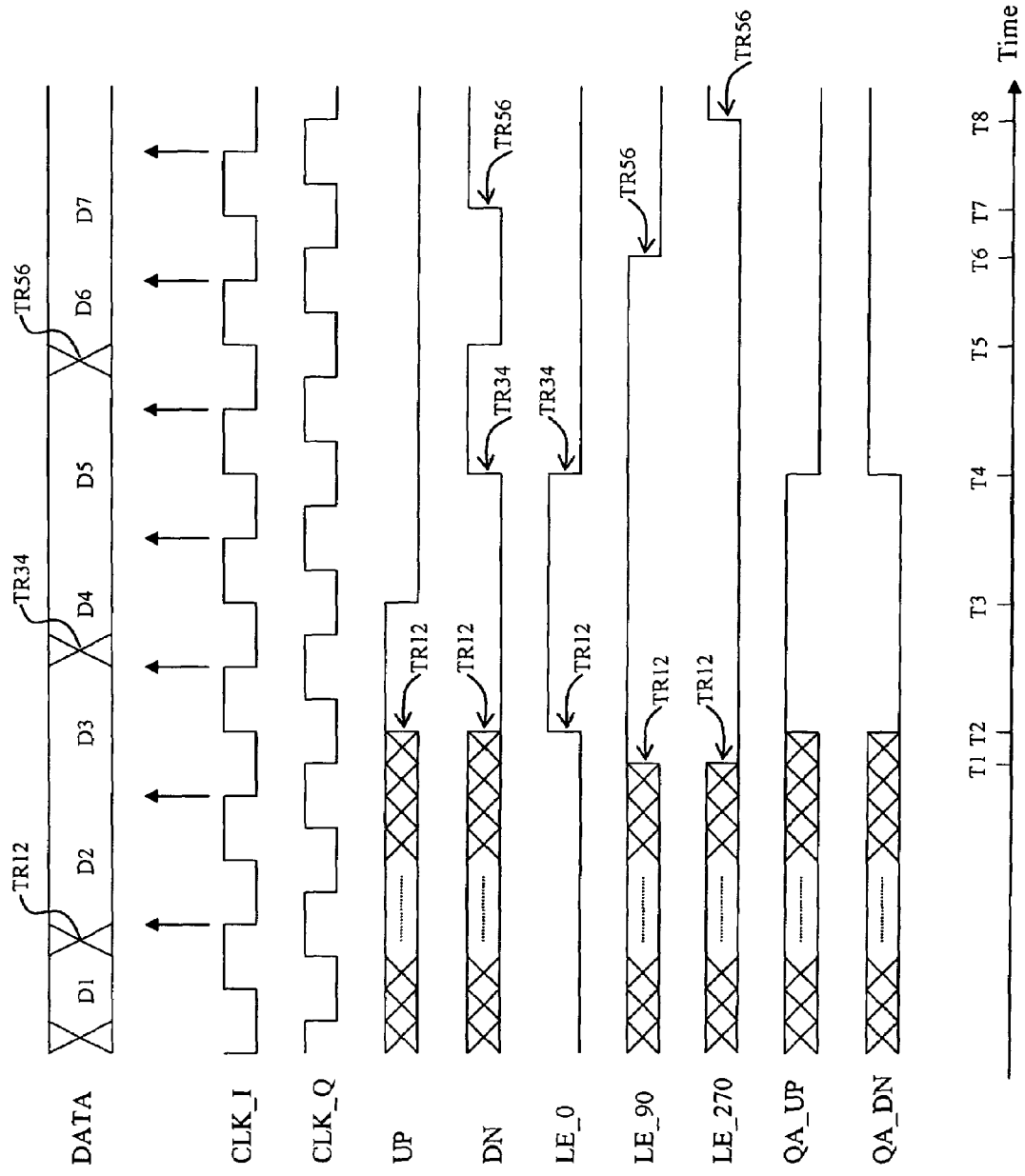
FIG. 10 shows example output waveforms of the PLL system of FIG. 3A with the input MODE signal being disabled and of the PLL system of FIG. 3B, when the phase and frequency are locked.

FIG. 10 shows example output waveforms of the PLL system 300A with the input MODE signal being disabled and of the PLL system 300B. It is assumed in the timing diagram of FIG. 10 that signals LE_0 is equal to zero initially and the PLL system is being phase-locked. It can be easily seen from FIG. 10 that the signals QA_UP and QA_DN from the frequency detectors (303 or 353) produce results that are consistent with the signals UP and DN from the in-phase detector 301 during phase lock. In other words, during phase lock, when signal UP from the in-phase detector 301 is asserted, signal QA_UP from the frequency detector 303 is also asserted to indicate that the VCO clock is running slow. Therefore, the charge up signal will be qualified as a valid signal to charge the charge-pump circuit. The same is true for the other case when signal QA_DN is asserted.

Exceptions may occur when data transition edges jump from time intervals I3 to I1 or from I2 to I4 (see FIG. 4) during two consecutive data transitions. In this case, the frequency detector (303 or 353) will disqualify both charge/discharge pulses from the in-phase detector 301. However, these situations require that the transition edges jitter more than 90 degrees of the VCO clock between two consecutive data transitions. Such kinds of events are rare in a well-behaved PLL system during phase lock and can be ignored. Therefore, the frequency detector operates transparently without influencing the operation of the phase detector during phase lock in PLL system 300B or in PLL system 300A when its input MODE signal is disabled.

Figure 11:
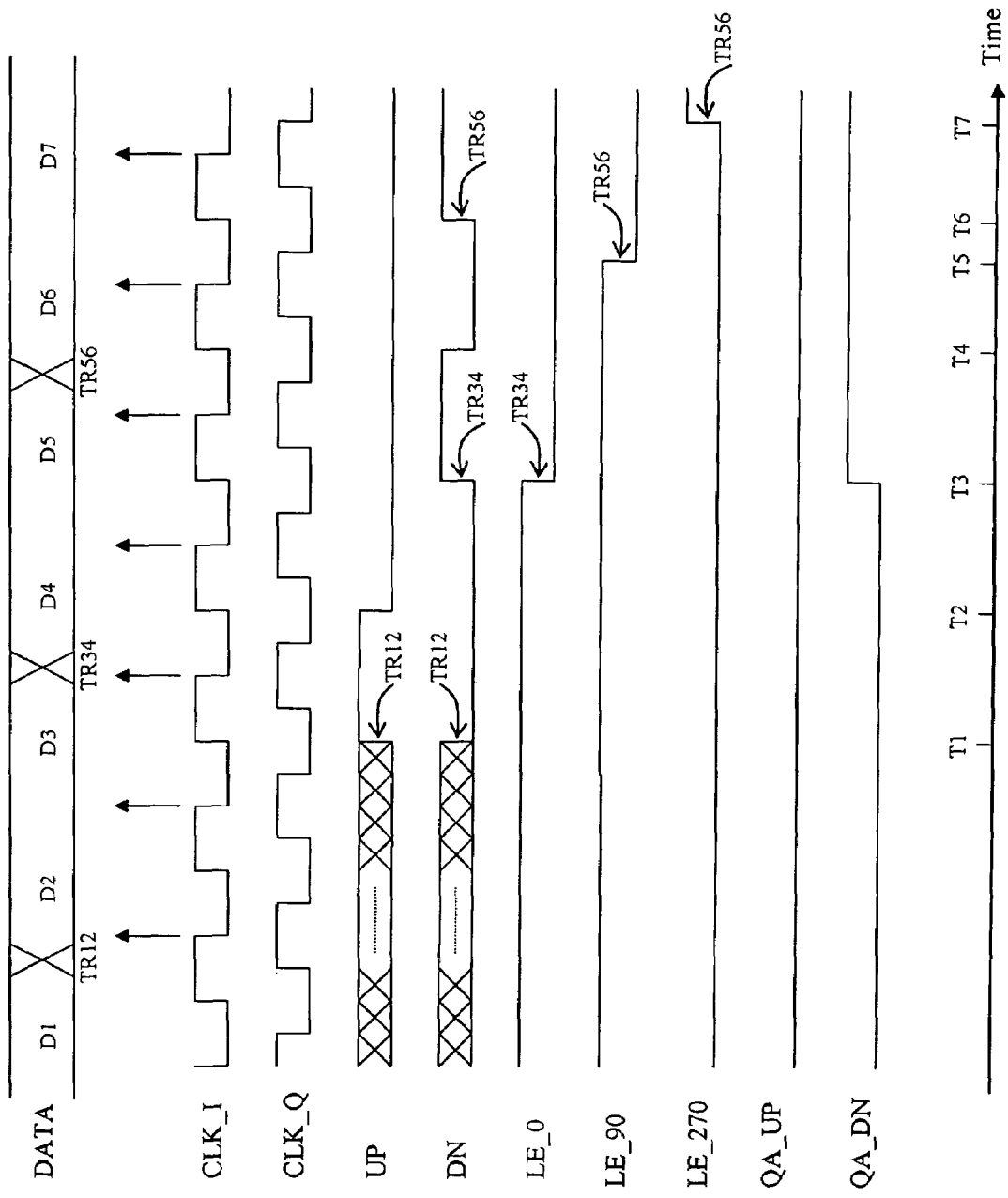
FIG. 11 shows example output waveforms of the PLL system of FIG. 3A with the input MODE signal being disabled and of the PLL system 300B, when the VCO clock is fast.

FIG. 11 shows example output waveforms of the PLL system 300A with the input MODE signal being disabled and of the PLL system 300B, when the VCO clock is fast. As shown in FIG. 11, transition edge TR12 leads the corresponding falling edge of in-phase clock CLK_I. Because the VCO clock is fast, transition edge TR34 starts lagging behind the falling edge of clock CLK_I. For this case, the resulting output signal LE_0 from the in-phase detector 301 is shown in FIG. 11. Signal LE_0 is de-asserted at time T3 due to transition edge TR34.

As shown in FIG. 11, transition edges TR12 and TR34 lead the falling edges of the quadrature-phase clock CLK_Q, while transition edge TR56 starts lagging behind the falling edge of clock CLK_Q. The resulting output signal LE_90 from the quadrature-phase detector 302 is shown in FIG. 11. Signal LE_90 is de-asserted at time T5 due to transition edge TR56. Similarly, transition edges TR12 and TR34 lag the rising edges of clock CLK_Q, while transition edge TR56 leads the rising edge of clock CLK_Q. The resulting output signal LE_270 from the quadrature-phase detector 302 is shown in FIG. 11. Signal LE_270 is asserted at time T7 due to transition edge TR56. At the falling edge of signal LE_0, the value of signal LE_90 is stored into latch 802 in PLL system 300A and latch 822 in PLL system 300B, which assert their output signals QA_DN at time T3. At the same time, the output signal QA_UP is de-asserted. Therefore, all the discharging pulses from the in-phase detector 301 are qualified as valid signals to drive the VCO 307 slower and all the charging pulse from the in-phase detector 301 are disqualified as invalid signals.

By qualifying or disqualifying the pulses from the in-phase detector, a PLL system in accordance with the present invention advantageously eliminates the need to precisely match the outputs of the in-phase detector and the frequency detector in order to provide the desired cancellation. Also, a lock-in detector is unnecessary in the PLL system because a frequency detector in the PLL system generates control signals consistent with the in-phase detector during phase lock. Furthermore, in the event of a false lock, a false lock circuit in the PLL system forces all the pump pulses from the in-phase detector to be qualified as valid pulses. This advantageously releases the PLL system from its false lock condition.

Figure 12:
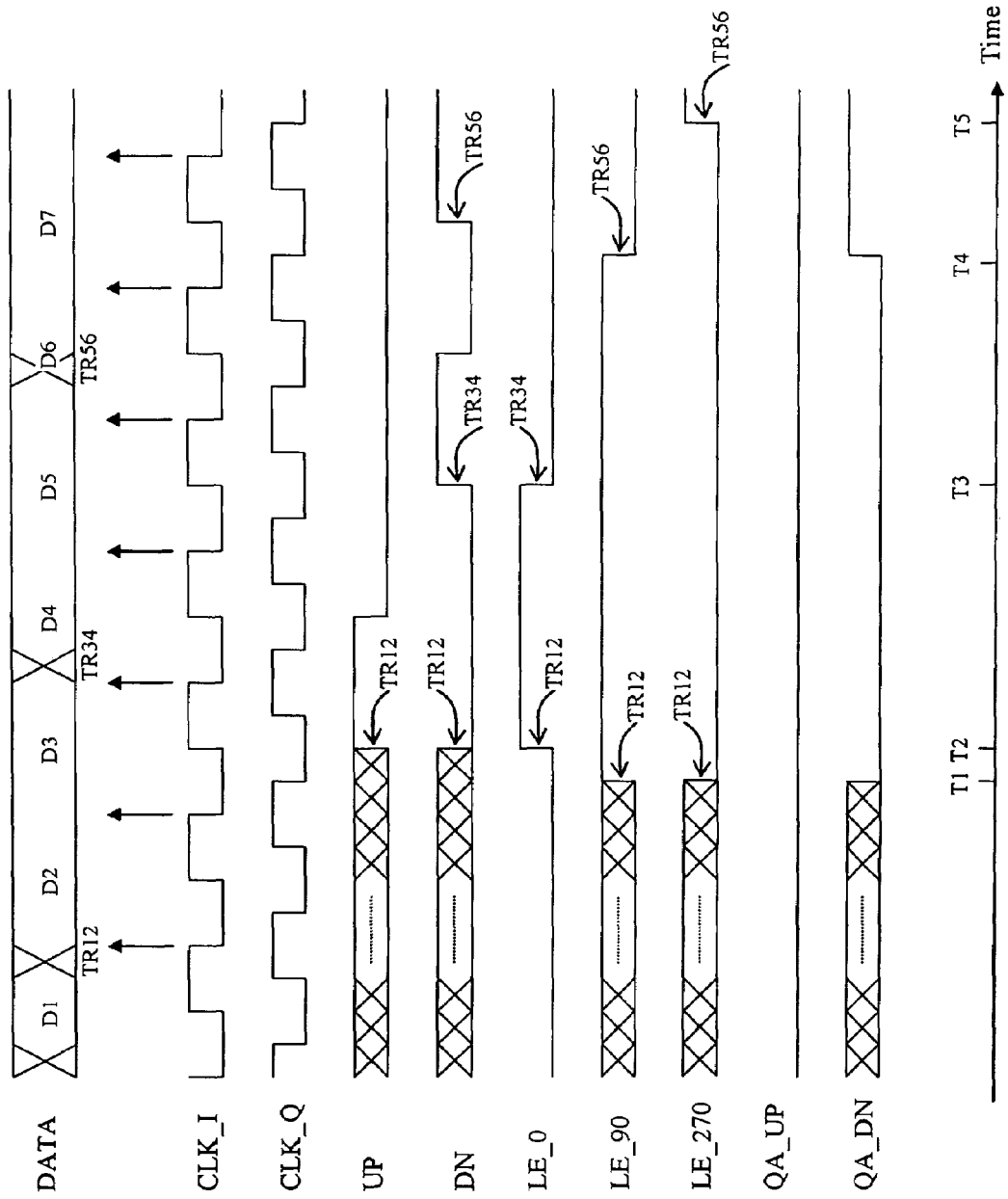
FIG. 12 shows output waveforms of the PLL system of FIG. 3A for the corresponding data transitions during phase lock when the input MODE signal is enabled.

FIG. 12 shows output waveforms of the PLL system 300A for the corresponding data transitions during phase lock when the input MODE signal is enabled. In the example of FIG. 12, because the input MODE signal is enabled, the frequency detector 303 acts as an aided phase detector. As is apparent from FIG. 12, the control signal QA_UP is de-asserted because no transition falls in the time interval 11 in this case. The output signals QA_DN is asserted at time T4 because transition edge TR56 falls in the interval 14. When the control signal QA_DN is asserted in this case, more current is discharged from the charge-pump to reduce the control voltage, resulting in smaller phase error. The resulting phase detection characteristic is shown in FIG. 9A.

Figure 13A:
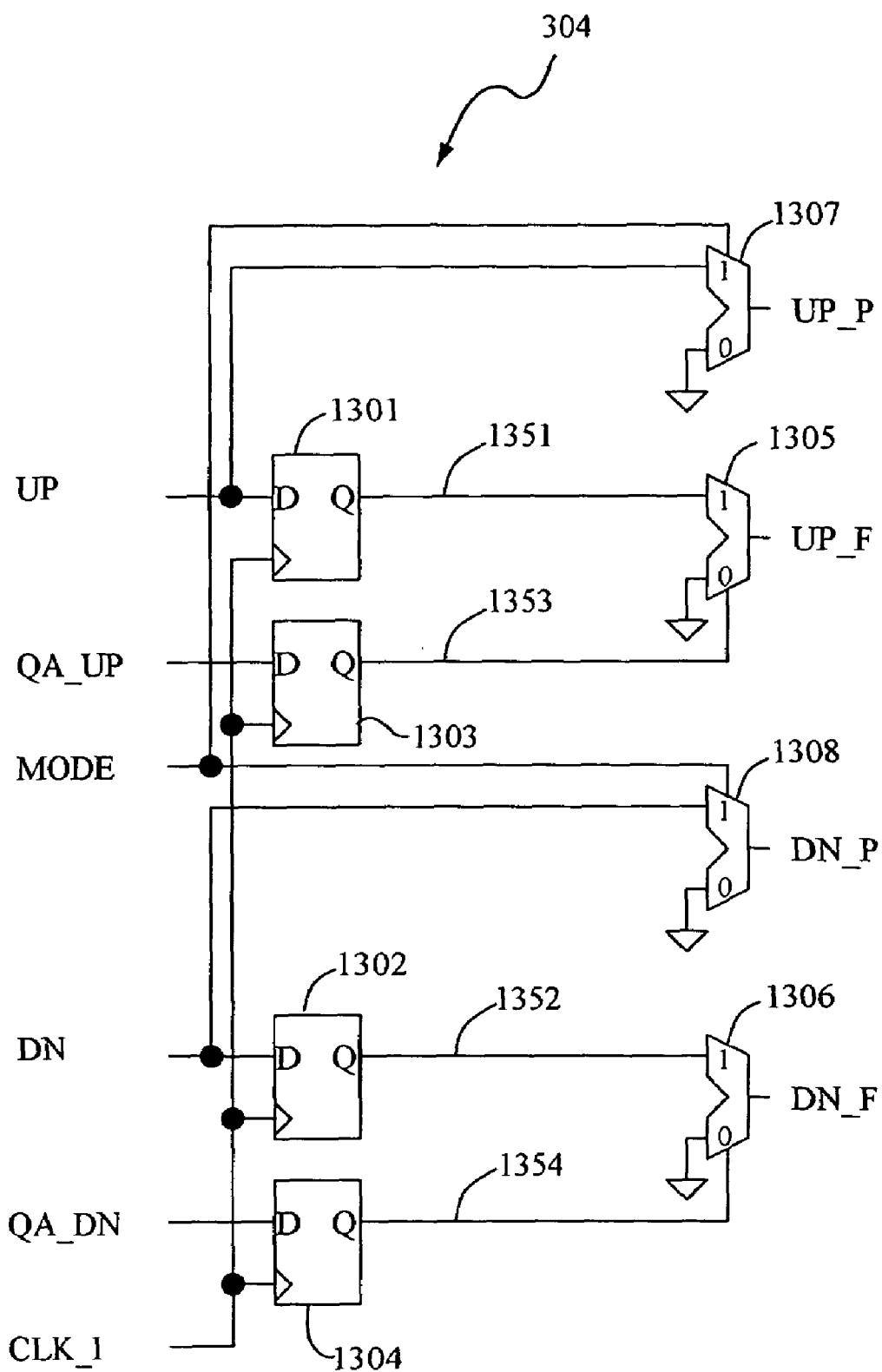
FIG. 13A shows a schematic diagram of a pump-pulse qualifier for the PLL system of FIG. 3A in accordance with an embodiment of the present invention.

FIG. 13A shows a schematic diagram of a pump-pulse qualifier 304 in accordance with an embodiment of the present invention. In the example of FIG. 13A, the input signals UP and DN come from the in-phase detector 301, the input signals QA_UP and QA_DN come from the frequency detector 303, the in-phase clock CLK_I comes from the VCO 307. The output signals UP_P, UP_F, DN_P, and DN_F are provided as drive signals to the charge pump 305.

When the input MODE signal is disabled, the output signals UP_P and DN_P are always set to zero. The input signals QA_UP and QA_DN qualify the input signals UP and DN, respectively, to generate the corresponding output signals UP_F and DN_F. The values of the output signals UP_F and DN_F depend on the input signals UP, DN, QA_UP, and QA_DN. If the input signal QA_UP is asserted, signal UP from the in-phase detector 301 is fed to the output signal UP_F. Otherwise, the output signal UP_F is set to zero. If the input signal QA_DN is asserted, signal DN from the in-phase detector 301 is fed to the output signal DN_F. Otherwise, the output signal UP_F is set to zero.

Figure 9B:
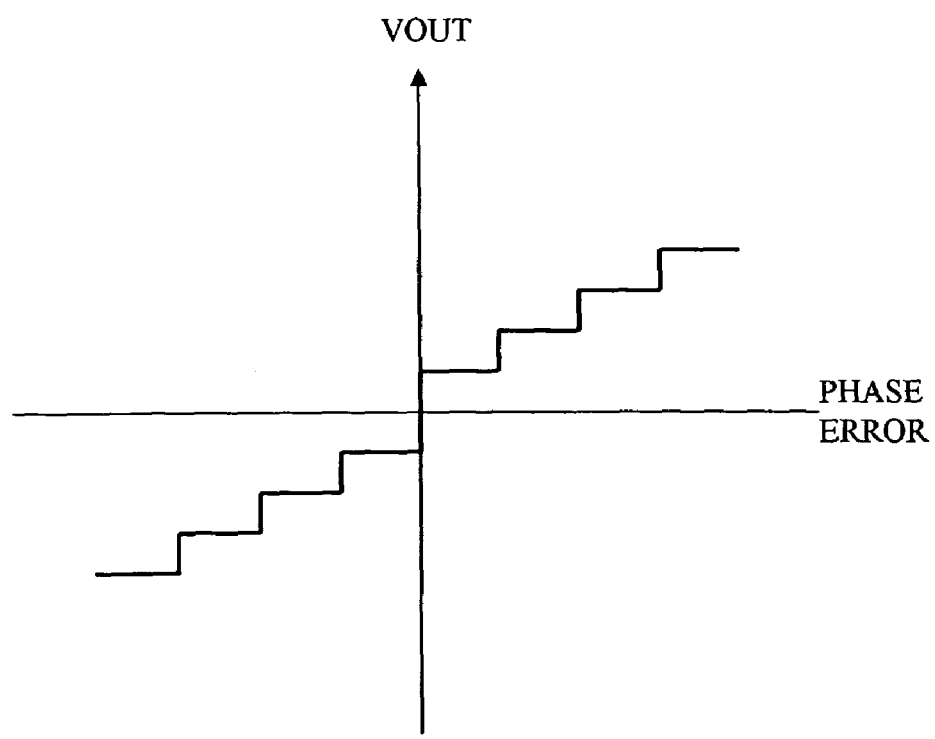
FIG. 9B shows the phase detection characteristic of the PLL system of FIG. 3A when more phases of the VCO clock are available.

When the input MODE signal is enabled, the output signals UP_P and DN_P reflect the changes of the input signals UP and DN. The output signals UP_F and DN_F are decided as described in the previous paragraph (i.e. in the case when the input MODE signal is disabled). When the last data transition falls in the time interval 11, the input signal QA_UP from the frequency detector 303 is asserted. If the input signal UP is asserted, then the output signals UP_F and UP_P will both be set to one. In this case, more pump up current is flowed to the charge-pump circuit 305. When the last data transition falls in the time interval 14, the input signal QA_DN from the frequency detector 303 is asserted. If the input signal DN is asserted, then the output signals DN_F and DN_P will both be set to one. In this case, more pump down current is flowed from the charge-pump circuit 305. The resulting PD characteristic is shown in FIG. 9A. The phase difference between the VCO clock and the incoming data can be resolved finer as shown in FIG. 9B if more phases of the VCO clock are available. Instead of generating a very narrow pulse for a small phase error as in a linear phase detector, a small phase error is resolved by providing different amount of currents but with a fixed pulse width in this embodiment. Thus a smaller static phase error during phase lock is achieved.

Still referring to FIG. 13A, flip-flops 1301, 1302, 1303, and 1304 are used to synchronize signals UP, DN, QA_UP, and QA_DN, respectively. The input '1's of multiplexers 1305 and 1306 are connected to the output of flip-flops 1301 and 1302, respectively. Also, the control inputs of the multiplexers 1305 and 1306 are connected to the output of flip-flops 1303 and 1304, respectively. If the synchronized signals 1353 and 1354 are asserted, signal 1351 is provided as output signal UP_F and signal 1352 is provided as signal DN_F. Otherwise, the output signals UP_F and DN_F are set to binary zero. When the input MODE signal is enabled, the output signal UP_P reflect the changes of the input signal UP and the output signal DN_P reflect the changes of the input signal DN. When the input MODE signal is disabled, both of the output signals UP_P and DN_P are set to binary zero.

Figure 13B:
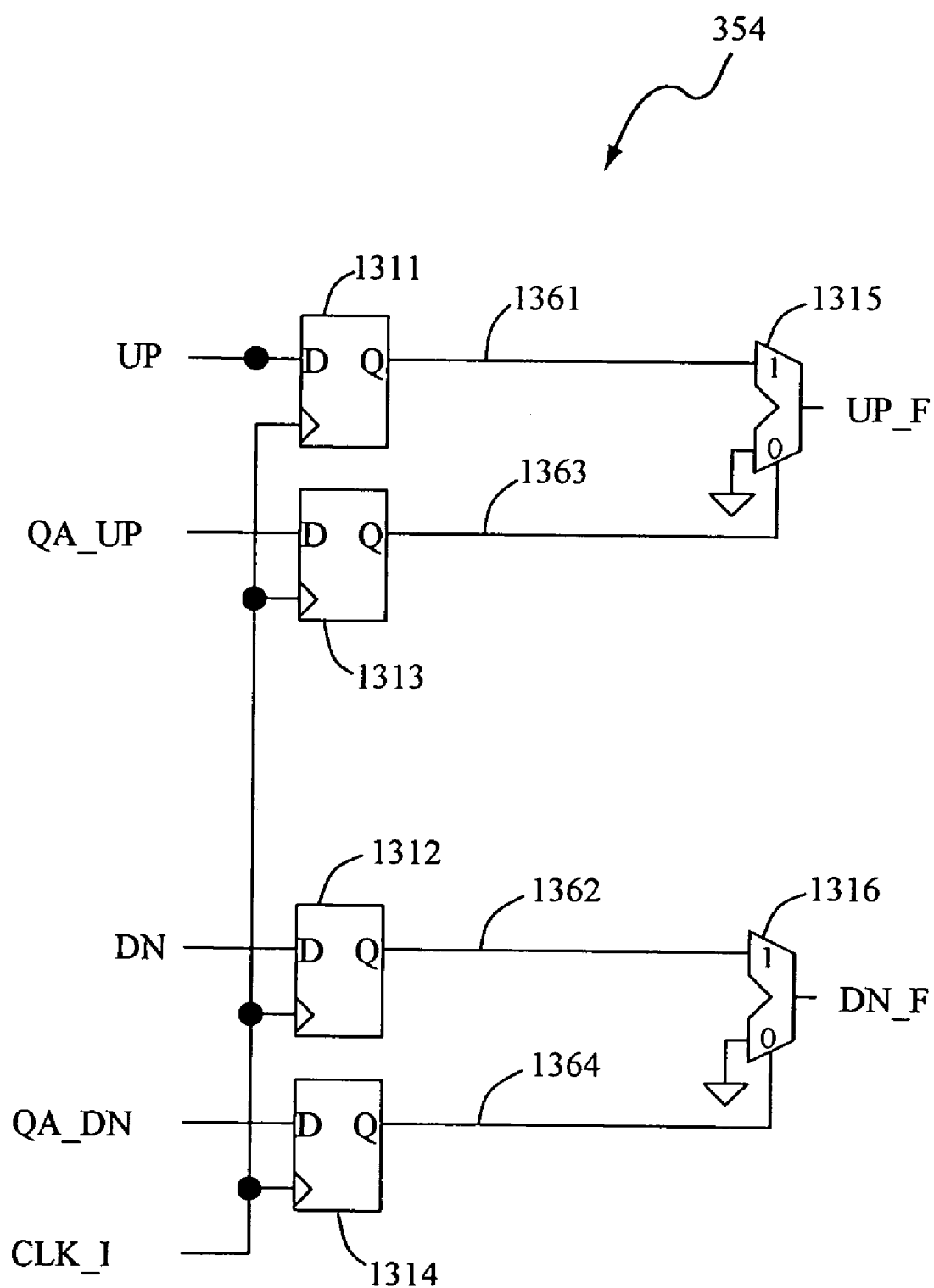
FIG. 13B shows a schematic diagram of a pump-pulse qualifier for the PLL system of FIG. 3B in accordance with an embodiment of the present invention.

FIG. 13B shows a schematic diagram of a pump-pulse qualifier 354 in accordance with an embodiment of the present invention. In the example of FIG. 13B, the input signals UP and DN come from the in-phase detector 301, the input signals QA_UP and QA_DN come from the frequency detector 353, and the in-phase clock CLK_I comes from the VCO 307. The output signals UP_F and DN_F are provided as drive signals to the charge pump 355.

The input signals QA_UP and QA_DN qualify the input signals UP and DN, respectively, to generate the corresponding output signals UP_F and DN_F. The values of the output signals UP_F and DN_F depend on the input signals UP, DN, QA_UP, and QA_DN. If the input signal QA_UP is asserted, signal UP from the in-phase detector 301 is fed to the output signal UP_F. Otherwise, the output signal UP_F is set to zero. If the input signal QA_DN is asserted, signal DN from the in-phase detector 301 is fed to the output signal DN_F. Otherwise, the output signal UP_F is set to zero.

Flip-flops 1311, 1312, 1313, and 1314 are used to synchronize signals UP, DN, QA_UP, and QA_DN, respectively. The input '1's of multiplexers 1315 and 1316 are connected to the output of flip-flops 1311 and 1312, respectively. Also, the control inputs of the multiplexers 1315 and 1316 are connected to the output of flip-flops 1313 and 1314, respectively. If the synchronized signals 1363 and 1364 are asserted, signal 1361 is provided as output signal UP_F and signal 1362 is provided as signal DN_F. Otherwise, the output signals UP_F and DN_F are set to binary zero.

Figure 14A:
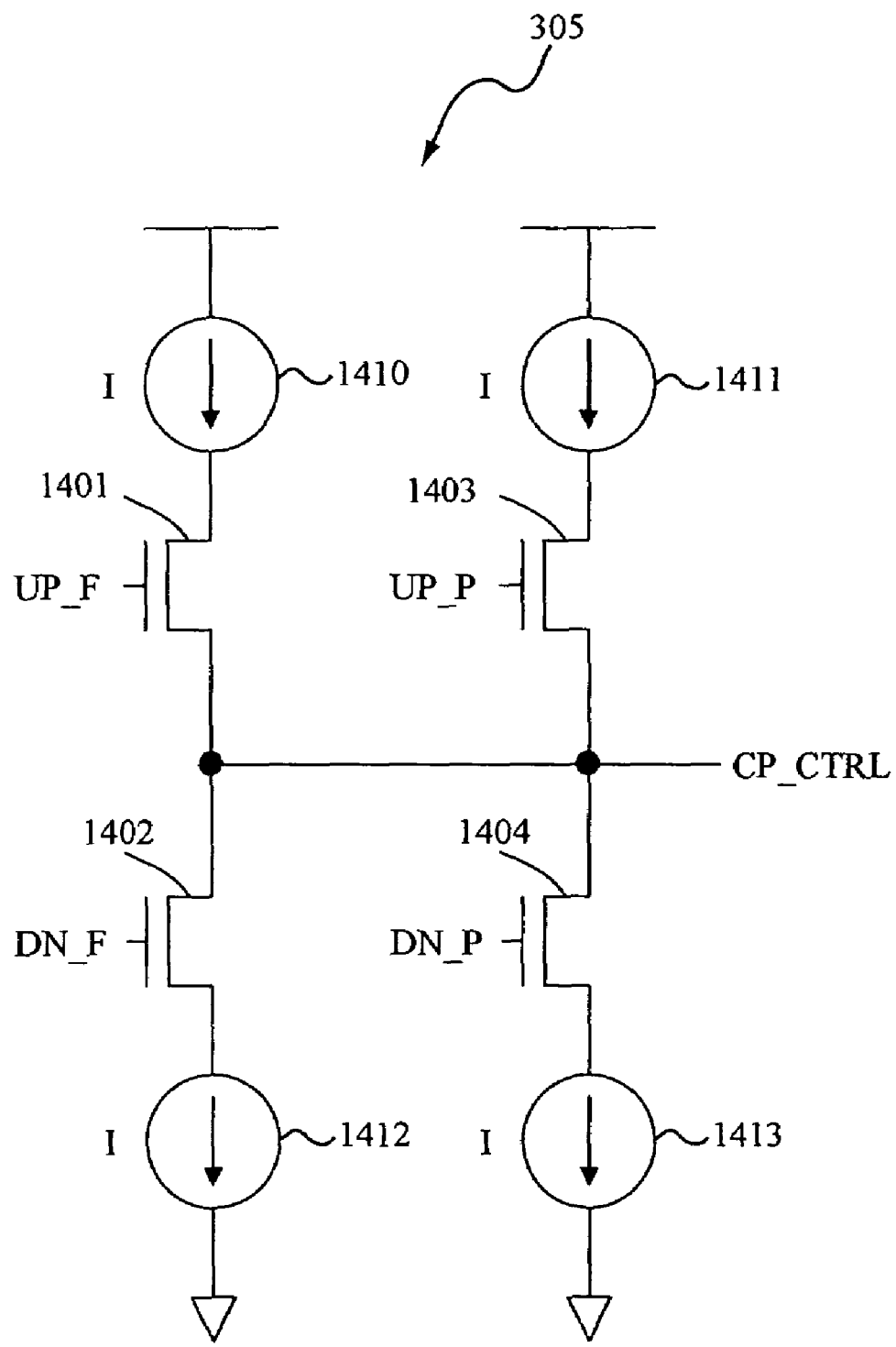
FIG. 14A shows a schematic diagram of a charge-pump circuit for the PLL system of FIG. 3A in accordance with an embodiment of the present invention.

FIG. 14A shows a schematic diagram of a charge-pump circuit 305 in accordance with an embodiment of the present invention. In the example of FIG. 14A, the input signals UP_F, DN_F, UP_P, and DN_P are from the pump-pulse qualifier 304. The output signal CP_CTRL is provided to the low pass filter 306 (see FIG. 3A) for low pass filtering before being used to adjust the clocking frequency of the VCO 307.

In the example of FIG. 14A, switch devices 1401 and 1403 charge the output signal CP_CTRL depending on whether their control input signals UP_F and UP_P are asserted or not. Similarly, switch devices 1402 and 1404 discharge the output signal CP_CTRL depending on whether their control input signals DN_F and DN_P are asserted or not. If the control input is asserted, the switch device becomes active. Otherwise, the switch device is inactive.

Figure 14B:
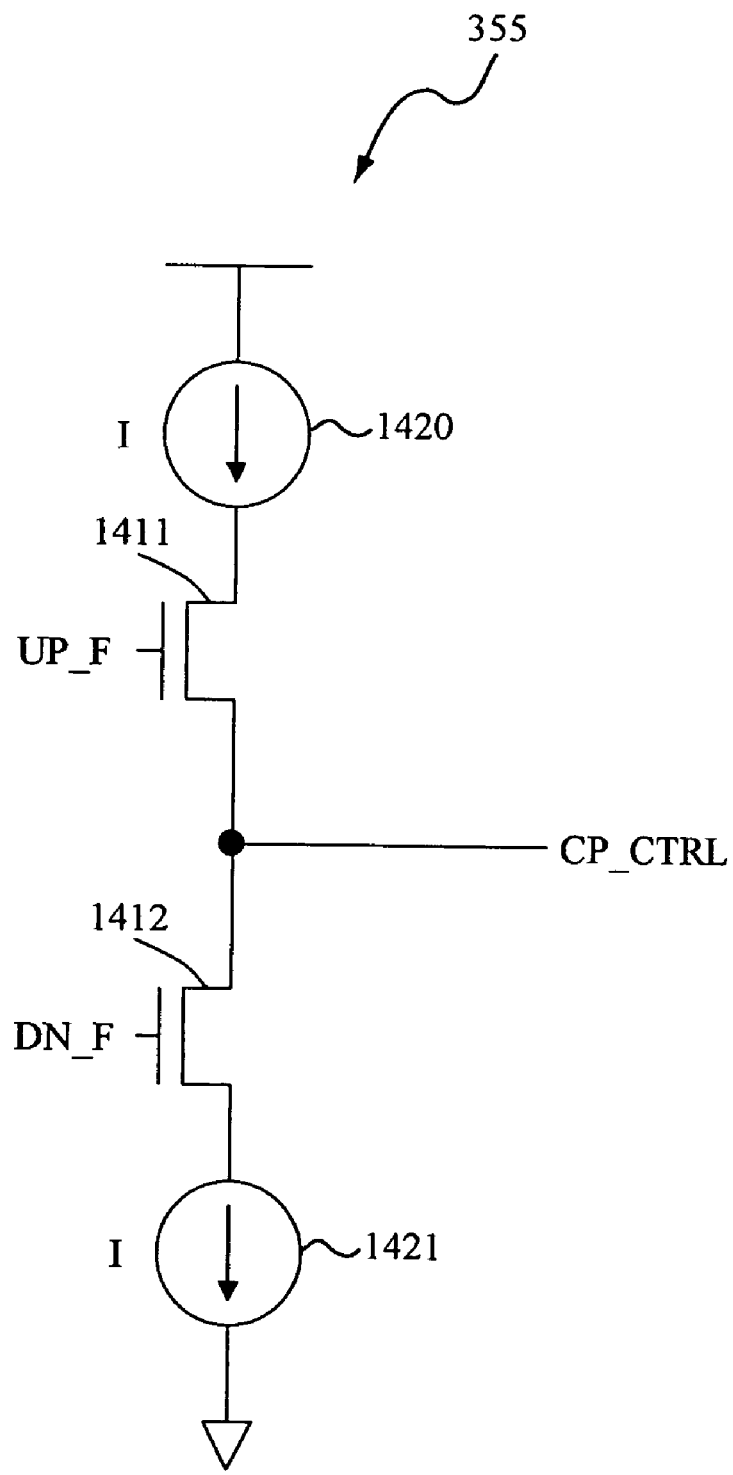
FIG. 14B shows a schematic diagram of a charge-pump circuit for the PLL system of FIG. 3B in accordance with an embodiment of the present invention.

FIG. 14B shows a schematic diagram of a charge-pump circuit 355 in accordance with an embodiment of the present invention. In the example of FIG. 14B, the input signals UP_F and DN_F are from the pump-pulse qualifier 354. The output signal CP_CTRL is provided to the low pass filter 306 (see FIG. 3B) for low pass filtering before being used to adjust the clocking frequency of the VCO 307. Switch device 1411 charges the output signal CP_CTRL depending on whether the control input signal UP_F is asserted or not. Similarly, switch device 1412 discharges the output signal CP_CTRL depending on whether the control input signal DN_F is asserted or not. If the control input is asserted, the switch device becomes active. Otherwise, the switch device is inactive.

As can be appreciated by those of ordinary skill in the art reading the present disclosure, embodiments of the invention are applicable to a PLL system operating at either the full baud rate or half baud rate of the incoming data. In a "full rate" embodiment, the frequency of the VCO clock is the same as the baud rate of the data bit stream. In a "half rate" embodiment, the frequency of the VCO clock is only half of the baud rate of the data bit stream. They differ only in circuit implementations, while the underlying functions and principles are exactly the same. Although the above described embodiments operate at full rate, they may be adapted to operate in half rate. Those skilled in the art can further extend the usage of the same principles to come up with other implementations, such as a "quad-rate" implementation where the frequency of the VCO clock is one quarter of the baud rate of the incoming data.

Figure 15:
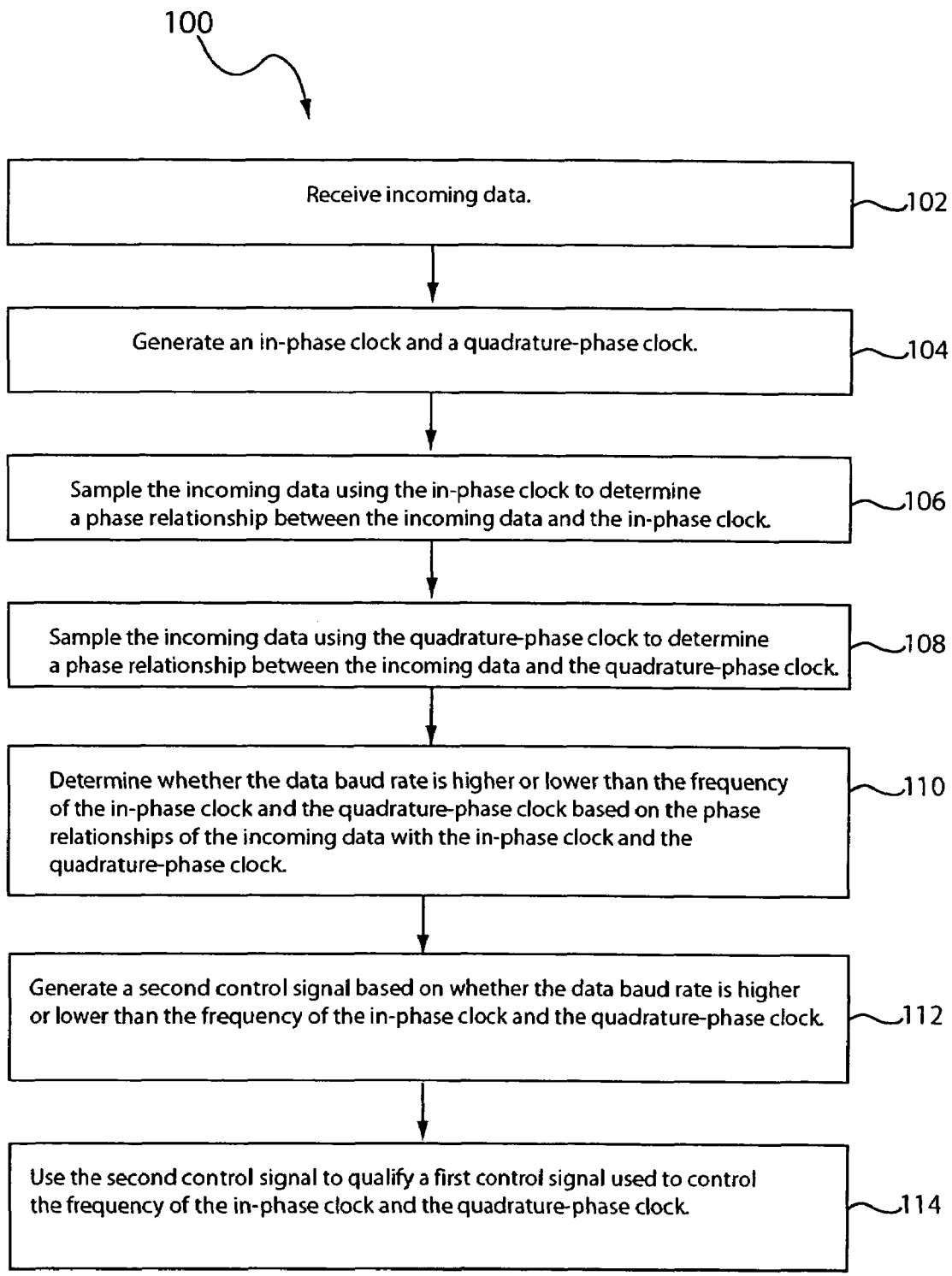
FIG. 15 shows a flow diagram of a method of processing incoming data in a communication receiver in accordance with an embodiment of the present invention.

Referring now to FIG. 15, there is shown a flow diagram of a method 100 of processing incoming data in a communication receiver in accordance with an embodiment of the present invention. The method 100 may be implemented using the PLL system 300A (see FIG. 3A) or the PLL system 300B (see FIG. 3B), for example. In light of the present disclosure, other PLL systems may also implement the method 100 without detracting from the merits of the present invention. The method 100 may be performed using electrical circuits in discrete form, in a single integrated circuit, or in multiple integrated circuits, for example. The method 100 may be employed to extract clock information from non-return to zero data, or other data not transmitted with a separate clock signal.

In step 102, incoming data are received in a communication receiver. The incoming data may be transmitted over a communication line (e.g. transmission line, cable) to the receiver. In one embodiment, the incoming data is encoded using conventional non-return to zero (NRZ) encoding scheme.

In step 104, the receiver generates an in-phase clock and a quadrature-phase clock. In one embodiment, the in-phase clock is configured to be adjusted such that it is in-phase with the incoming data, while the quadrature-phase clock is configured to be 90 degrees out of phase with the in-phase clock. The in-phase clock and the quadrature-phase clock are running at the same frequency. The in-phase clock and the quadrature-phase clock may be generated by conventional voltage-controlled oscillator (VCO) circuit.

In step 106, the incoming data is sampled using the in-phase clock to determine a phase relationship between the incoming data and the in-phase clock. Step 106 may be performed using an in-phase detector, such as the in-phase detector 301 (see FIGS. 3A, 3B, and 5), for example.

In step 108, the incoming data is sampled using the quadrature-phase clock to determine a phase relationship between the incoming data and the quadrature-phase clock. Step 108 may be performed using a quadrature-phase detector, such as the quadrature-phase detector 302 (see FIGS. 3A, 3B, and 6), for example.

In step 110, a determination is made as to whether the baud rate of the incoming data is higher or lower than the frequency of the in-phase clock and the quadrature phase clock based on the phase relationship between the incoming data and the in-phase clock and the phase relationship between the incoming data and the quadrature-phase clock. Step 110 may be performed using a frequency detector, such as the frequency detector 303 (see FIGS. 3A and 8A) or the frequency detector 353 (see FIGS. 3B and 8B), for example.

In step 112, a second control signal is generated based on whether the data baud rate is higher or lower than the frequency of the in-phase clock and the quadrature-phase clock. The second control signal may be generated by the frequency detector used to perform step 110.

In step 114, the second control signal is used to qualify a first control signal that is used to control the frequency of the in-phase clock and the quadrature-phase clock. Step 114 may be performed by having the frequency detector used in steps 110 and 112 provide the second control signal to a qualifier circuit. Examples of such a qualifier circuit include the pump-pulse qualifier 304 (see FIGS. 3A and 13A) and the pump-pulse qualifier 354 (see FIGS. 3B and 13B). If the first control signal is deemed invalid, the pump-pulse qualifier prevents the first control signal from being used to adjust the frequency of the VCO circuit that generates the in-phase clock and the quadrature-phase clock. If the first control signal is deemed valid, the pump-pulse qualifier allows the first control signal to drive a charge pump, whose output is filtered by a loop filter prior to being received by the VCO circuit.

Improved phase and frequency detectors have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A phase-locked loop (PLL) system in a communication receiver, the PLL system comprising:
a clock circuit configured to generate a first clock signal;
a first phase detector configured to sample incoming data using the first clock signal, the phase detector being configured to detect a phase relationship between the incoming data and the first clock signal, the phase detector being configured to generate a first control signal to adjust a frequency of the first clock signal;
a frequency detector configured to generate a second control signal based on a phase relationship between the incoming data and the first clock signal; and
a qualifier circuit configured to qualify the first control signal based on the second control signal, the qualifier circuit being configured to prevent the first control signal from being used to adjust the frequency of the first clock signal if the second control signal indicates that the first control signal is an invalid signal.

2. The PLL system of claim 1 further comprising:
a second phase detector configured to sample the incoming data using a second clock signal generated by the clock circuit, the first clock signal and the second clock signal having the same frequency but are out of phase with each other, the second phase detector being configured to determine a phase relationship between the incoming data and the second clock signal.

3. The PLL system of claim 2 wherein the frequency detector determines if a baud rate of the incoming data is higher or lower than the frequency of the first clock signal and the second clock signal based on the phase relationship between the incoming data and the first clock signal and the phase relationship between the incoming data and the second clock signal.

4. The PLL system of claim 3 further comprising:
a charge pump circuit configured to receive the first control signal from the qualifier circuit if the second control signal indicates that the first control signal is a valid signal, the charge pump circuit being configured to generate a third control signal to adjust the frequency of the first clock signal based on the first control signal.

5. The PLL system of claim 4 further comprising:
a low pass filter configured to low pass filter the third control signal before coupling the third control signal to the clock circuit.

6. The PLL system of claim 1 wherein the frequency detector further comprises:
a false lock circuit configured to detect if the PLL system is being false locked.

7. The PLL system of claim 1 wherein the frequency detector is configured to receive an input MODE signal, wherein when the input MODE signal is enabled the frequency detector is configured to act as an aided phase detector to obtain finer resolution of phase error as compared to when the input signal MODE is disabled.

8. The PLL system of claim 7 wherein when the input MODE signal is enabled the frequency detector asserts the second control signal such that a charge pump circuit pumps more current into a loop filter driving the clock circuit.

9. The PLL system of claim 2 wherein the the second phase detector outputs a first phase signal indicative of a phase relationship between a falling edge of the second clock signal and a transition edge of the incoming data and outputs second phase signal indicative of a phase relationship between a rising edge of the second clock signal and the transition edge of the incoming data.

10. A method of processing incoming data in a communication receiver, the method comprising:
receiving the incoming data in the receiver;
generating a first clock and a second clock in the receiver, the first clock and the second clock running at a same frequency and are out of phase with each other;
sampling the incoming data using the first clock to determine a phase relationship between the incoming data and the first clock;
sampling the incoming data using the second clock to determine a phase relationship between the incoming data and the second clock;
generating a control signal to adjust the frequency of the first clock and the second clock;
qualifying the control signal based on the sampling of the incoming data using the first clock and the second clock, wherein if the control signal is not qualified as a valid signal the control signal is prevented from being used to adjust the frequency of the first clock and the second clock.

11. The method of claim 10 wherein the first clock and second clock are 90 degrees out of phase.

12. The method of claim 10 wherein the control signal is configured to control charging of a charge pump circuit.

13. The method of claim 12 further comprising:
if the control signal is qualified as a valid signal:
providing the control signal to the charge pump circuit;
low pass filtering an output signal of the charge pump circuit;
using the low pass filtered output of the charge pump circuit to adjust a clocking frequency of a voltage controlled oscillator generating the first clock and the second clock.

14. The method of claim 10 further comprising:
determining if a baud rate of the incoming data is higher or lower than the frequency of the first clock and the second clock based on the phase relationship between the incoming data and the first clock and the phase relationship between the incoming data and the second clock.

15. The method of claim 14 wherein the control signal is qualified based on whether the baud rate of the incoming data is higher or lower than the frequency of the first clock and the second clock.

16. The method of claim 10 wherein the first clock is configured to be adjusted to become in-phase with the incoming data and the second clock is configured to be 90 degrees out of phase with the first clock.

17. A phase-locked loop (PLL) system in a communication receiver, the PLL system comprising:
clock generation means for generating a first clock and a second clock that have a same frequency and are out of phase with each other;
charge pump means for controlling the frequency of the first clock and the second clock, the charge pump means being driven by a first control signal;
first phase detection means for sampling incoming data using the first clock and for determining a phase relationship between the incoming data and the first clock;
second phase detection means for sampling the incoming data using the second clock and for determining a phase relationship between the incoming data and the second clock;
frequency detection means for generating a second control signal based on phase relationships between the incoming data and the first clock and the incoming data and the second clock; and
qualifier means for determining if the first control signal is a valid or invalid signal based on the second control signal, wherein the first control signal is not provided to the charge pump means if the first control signal is deemed invalid.

18. The PLL system of claim 17 wherein the incoming data comprise non-return to zero (NRZ) data.

19. The PLL system of claim 17 wherein the second clock is 90 degrees out of phase with the first clock.

20. The PLL system of claim 17 wherein the frequency detection means comprise a false lock detection circuit for determining if the PLL system is being false locked.

* * * * *